United States Patent
Martin et al.

(10) Patent No.: US 11,973,520 B2
(45) Date of Patent: *Apr. 30, 2024

(54) TECHNIQUES FOR DETERMINING COMPRESSION TIERS AND USING COLLECTED COMPRESSION HINTS

(71) Applicant: EMC IP Holding Company LLC, Hopkinton, MA (US)

(72) Inventors: Owen Martin, Hopedale, MA (US); Alesia A. Tringale, Worcester, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/984,597

(22) Filed: Nov. 10, 2022

(65) Prior Publication Data
US 2023/0067717 A1 Mar. 2, 2023

Related U.S. Application Data

(63) Continuation of application No. 16/528,898, filed on Aug. 1, 2019, now Pat. No. 11,533,063.

(51) Int. Cl.
*H03M 7/30* (2006.01)
*G06F 3/06* (2006.01)
*G06F 13/16* (2006.01)

(52) U.S. Cl.
CPC ............ *H03M 7/60* (2013.01); *G06F 3/0608* (2013.01); *G06F 3/0659* (2013.01);
(Continued)

(58) Field of Classification Search
CPC ..... H03M 7/60; H03M 7/3084; G06F 3/0608; G06F 3/0659; G06F 3/0673; G06F 13/1668
See application file for complete search history.

(56) References Cited

U.S. PATENT DOCUMENTS 9,048,862 B2 * 6/2015 Condict ................ H03M 7/607
9,454,321 B1 * 9/2016 Smaldone ............... G06F 3/061
(Continued)

OTHER PUBLICATIONS

Zou et al., "Improving I/O Performance with Adaptive Data Compression for Big Data Applications", IEEE (Year: 2014).*
(Continued)

*Primary Examiner* — Debbie M Le
*Assistant Examiner* — Huen Wong
(74) *Attorney, Agent, or Firm* — Muirhead and Saturnelli, LLC

(57) ABSTRACT

Tiers of compression algorithms may be determined using compression information collected regarding compression ratios achieved for data sets using compression algorithms. Each tier may meet specified criteria regarding expected compression ratios achieved for a specified portion or number of data sets. Compression algorithms of each tier may be implemented by a different hardware device that may include hardware accelerators for the algorithms of the tier. Different tiers, and thus different hardware devices, achieve different levels of compression. A recommendation may be provided using compression information collected, such as from one of the hosts, regarding which hardware device to use for compression. The recommendation may be to purchase a license to use or whether to purchase a particular hardware device for compression. Compression information may be collected by a host that issues tagged I/Os providing a hint regarding what compression algorithm to use for the particular I/O operation data.

20 Claims, 17 Drawing Sheets

(52) U.S. Cl.
CPC ........ *G06F 3/0673* (2013.01); *G06F 13/1668* (2013.01); *H03M 7/3084* (2013.01)

(56) References Cited

U.S. PATENT DOCUMENTS

| | | |
|---|---|---|
| 10,437,474 B1* | 10/2019 | Armangau .............. G06F 3/061 |
| 2004/0086039 A1* | 5/2004 | Reynolds ......... H04N 21/23439 |
| | | 375/240.1 |
| 2004/0179284 A1* | 9/2004 | Martin ............. G11B 20/00007 |
| 2014/0207745 A1* | 7/2014 | Groseclose ............. H03M 7/30 |
| | | 707/693 |
| 2016/0353151 A1* | 12/2016 | Majid ................ H04N 21/2543 |

OTHER PUBLICATIONS

Yoon et al., "Adaptive Sensing and Compression Rate Selection Scheme for Energy-harvesting Wireless Sensor Networks", International Journal of Distributed Sensor Networks (Year: 2017).*

* cited by examiner

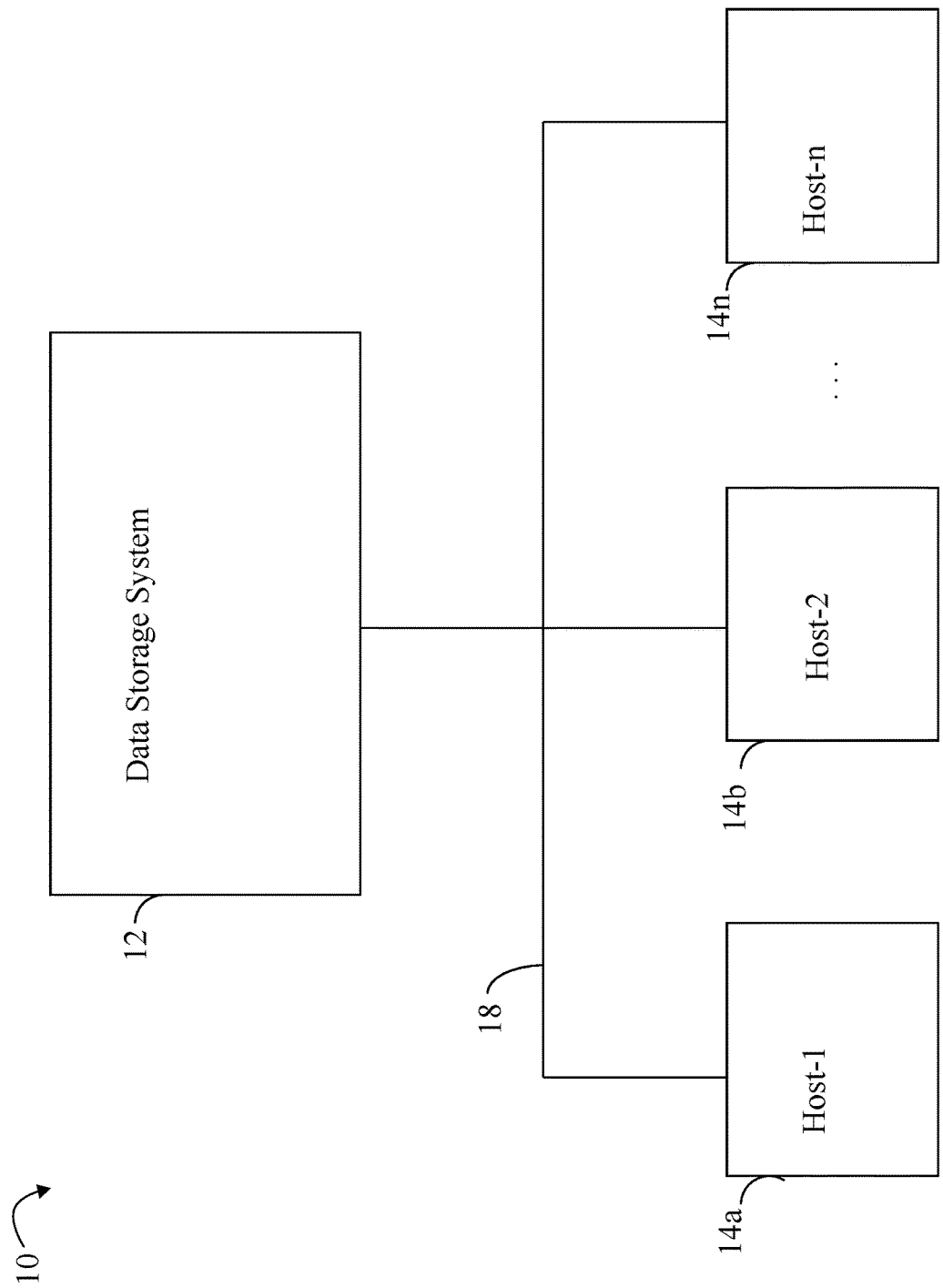

| LUN ID 302 | Compression Algorithm 304 | Compression Ratio 306 | Total TBs sampled 308 | Total time 310 |
|---|---|---|---|---|
| 100 | Algorithm A1 | 2:1 | 33 | 2572 hours |
| 100 | Algorithm B1 | 3:1 | 22 | 2600 hours |
| 200 | Algorithm A1 | 1:1 | 35 | 2572 hours |
| 200 | Algorithm B1 | 9:1 | 12 | 2400 hours |
| .. .. | .. .. | .. .. | .. .. | .. .. |

FIG. 6

| LUN ID | Licenses |
|---|---|
| 1 | Basic, Premium, Custom |
| 2 | Basic |
| 3 | Basic |
| 4 | Basic, Premium |
| .. .. | .. .. |

FIG. 10

TECHNIQUES FOR DETERMINING COMPRESSION TIERS AND USING COLLECTED COMPRESSION HINTS

BACKGROUND

Technical Field

This application generally relates to data storage, and more particularly, data reduction techniques that may be performed to reduce the size of stored data.

Description of Related Art

Data storage systems may include resources used by one or more host systems. Data storage systems and host systems may be interconnected by one or more communication connections such as in a network. These resources may include, for example, data storage devices such as those included in the data storage systems. These data storage systems may be coupled to one or more host systems where the data storage systems provide storage services to each host system. Multiple data storage systems from one or more different vendors may be connected and may provide data storage services for one or more host systems.

A host may perform a variety of data processing tasks and operations. For example, a host may perform I/O operations such as data read and write operations sent to the data storage system.

Host systems may store data to and/or retrieve data from a storage device included in a data storage system containing a plurality of host interface units, physical storage devices or drives, and physical storage interface units. The storage device may be a logical storage device. The host systems access the storage device through a plurality of channels provided therewith. Host systems may perform read and write operations through the channels to the data storage system and the data storage system provides data to the host systems also through the channels. The host systems do not address the physical storage devices or drives of the data storage system directly, but rather, access what appears to the host systems as a plurality of logical storage devices or units (which may or may not correspond to the actual physical storage devices or drives). Allowing multiple host systems to access a single storage device allows the host systems to share data of the storage device. In order to facilitate sharing of the data on the storage device, additional software on the data storage systems may also be used.

An application may execute on a host where the application performs I/O (input/output) operations. The host may be able to transmit the data operation to the data storage system over any one or more different paths or multiple paths. Multipathing functionality, such as for path selection and management of the multiple paths, may be handled by a device driver of the host. When an application on the host issues an I/O operation, it may be received by a device driver of the host which facilitates sending and/or receiving transmissions between the application and the data storage system.

SUMMARY OF THE INVENTION

Embodiments of the techniques herein include a method, computer readable medium and system for determining and using a plurality of tiers of compression algorithms. Such techniques include receiving a plurality of sets of compression information for a plurality of compression algorithms used to compress for a plurality of data sets, wherein each of the plurality of sets of compression information is collected for I/O operations issued to a different one of a plurality of data storage systems; determining, using the plurality of sets of compression information, a first of the plurality of tiers of compression algorithms, wherein each compression algorithm of the plurality of compression algorithms in the first tier achieves first estimated compression ratio criteria for at least a first portion of the plurality of data sets, wherein compression algorithms in the first tier are implemented using a first hardware (HW) device; determining, using the plurality of sets of compression information, a second of the plurality of tiers of compression algorithms, wherein each compression algorithm of the plurality of compression algorithms in the second tier achieves second estimated compression ratio criteria for at least a second portion of the plurality of data sets, wherein each compression algorithm in the second tier is expected to achieve a higher rate of compression than compression algorithms in the first tier, wherein compression algorithms in the second tier are implemented using a second HW device; and providing a recommendation, in accordance with one of the plurality of sets of compression information regarding I/O operations issued to one of the plurality of data storage systems, regarding whether to use the first HW device or the second HW device in connection with compression on the one data storage system. The one data storage system may include the first HW device and the recommendation may be whether to purchase the second HW device. The recommendation may be whether to purchase a license to use the second HW device.

The compression ratio criteria may indicate that each compression algorithm in the first tier has a specified compression ratio for at least the first portion of the plurality of data sets. The first compression ratio criteria may indicate that each compression algorithm in the first tier has a compression ratio in a specified compression ratio range. The second compression ratio criteria may indicate that each compression algorithm in the second tier has a specified compression ratio for at least the second portion of the plurality of data sets. The second compression ratio criteria may indicate that each compression algorithm in the second tier has a compression ratio in a specified compression ratio range.

In at least one embodiment, a first of the plurality of sets of compression information may be collected by a host in connection with I/Os directed to at least some of the plurality of data sets stored on a first data storage system, and wherein the first set of compression information is sent from the host to a centralized collection site. The first set of compression information may be sent to the first data storage system, and then from the first data storage system to the centralized collection site.

In at least one embodiment, a first of the plurality of sets of compression information may be collected by a first data storage system in connection with I/Os directed to at least some of the plurality of data sets stored on the first data storage system, and the first set of compression information may be sent from the first data storage system to a centralized collection site.

In at least one embodiment, a first of the plurality of sets of compression information may be collected by a host in connection with I/Os directed to at least some of the plurality of data sets stored on a first data storage system, and the method may include: receiving the first set of compression information from the host at the first data storage system; receiving, from the host at the first data storage system, a first write I/O operation that writes first data and is directed to a first of the plurality of data sets stored on the first data storage system; selecting, in accordance with the first set of compression information, one of the plurality of compression algorithms included in a particular one of the first tier or the second tier to use to compress the first data stored in the first data set; and compressing the first data using a particular one of the first HW device and the second HW device implementing the particular one of the plurality of compression algorithms selected. Selecting the one of the plurality of compression algorithms included in the particular one of the first tier or the second tier to use to compress the first data stored in the first data set may be performed using licensing information. The licensing information may indicate whether the particular one of the first HW device and the second HW device is licensed for use by the first data set. The licensing information may include licensing information for at least some of the plurality of data sets identifying whether each of the first HW device and the second HW device is licensed for use by said each of the at least some of the plurality of data sets.

In at least one embodiment, a first of the plurality of sets of compression information may be collected by a host in connection with I/Os directed to at least some of the plurality of data sets stored on a first data storage system, and the method may include: receiving, on the host from an application, a first write I/O operation that writes first data and is directed to a first of the plurality of data sets stored on the first data storage system; selecting, by the host and in accordance with the first set of compression information, a particular one of the plurality of compression algorithms included in a particular one of the first tier or the second tier to use to compress the first data stored in the first data set; tagging the first write I/O operation with a tag identifying the particular one of the plurality of compression algorithms; sending the first write I/O operation with the tag from the host to the first data storage system; and performing first processing on the first data storage system to determine which of the plurality of compression algorithms to use to compress the first data stored in the first data set. The first processing may use licensing information for the first data set identifying whether each of the first HW device and the second HW device is licensed for use by the first data set. Each of the plurality of data sets may include any of: one or more logical devices, one or more file-based entities, data used by one or more hosts, a portion of a logical device, a plurality of portions of a plurality of logical devices, and data used by one or more applications.

BRIEF DESCRIPTION OF THE DRAWINGS

Features and advantages of the present invention will become more apparent from the following detailed description of exemplary embodiments thereof taken in conjunction with the accompanying drawings in which:

FIG. 1 is an example of an embodiment of a system that may utilize the techniques described herein;

FIG. 6 is an example illustrating information that may be collected for use in an embodiment in accordance with the techniques herein;

FIGS. 10 and 12 are examples of licensing information that may be used in an embodiment in accordance with the techniques herein;

Figure 2A:
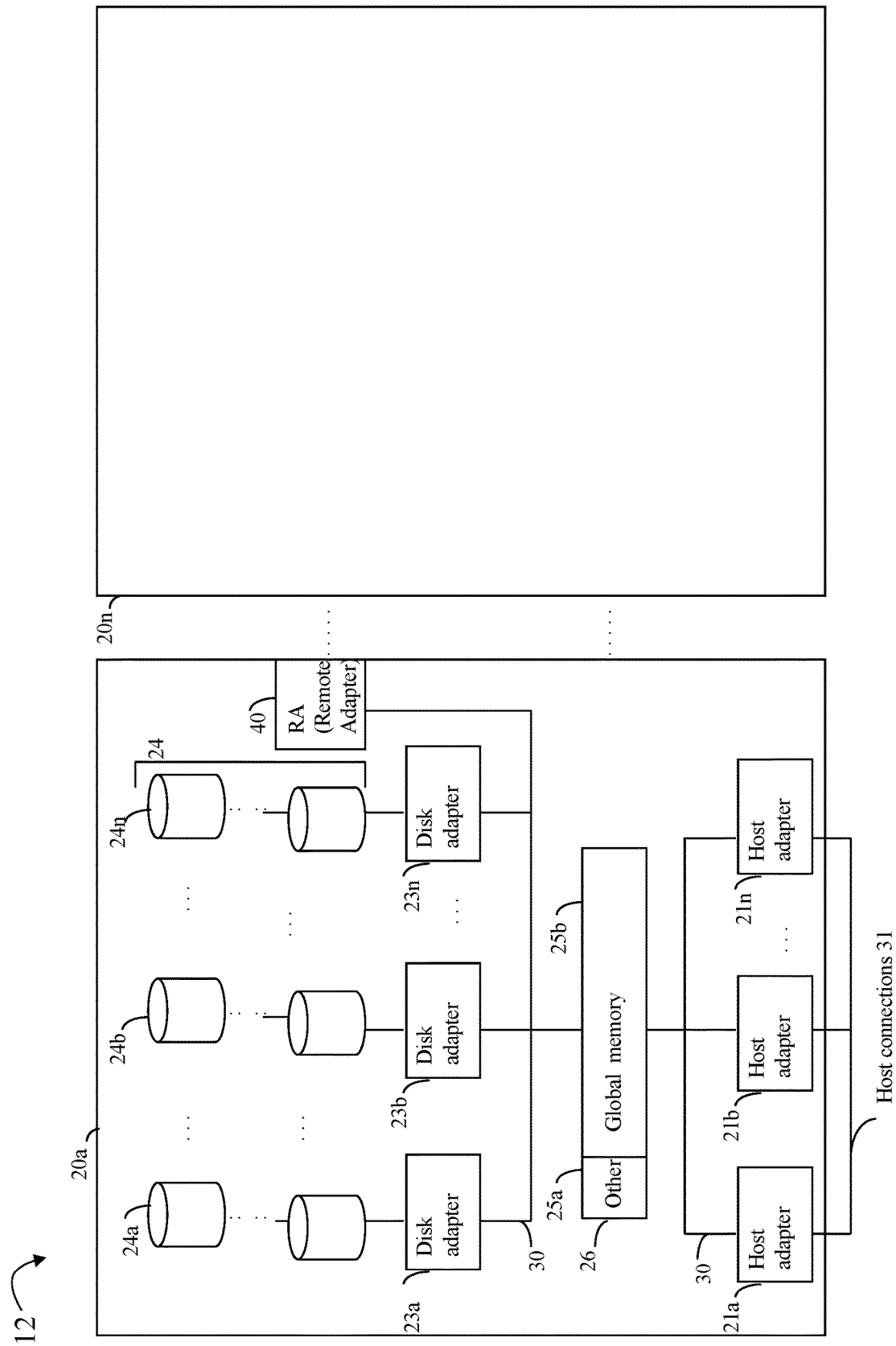
FIG. 2A is an example of an embodiment of a data storage system.

DETAILED DESCRIPTION OF
EMBODIMENT(S)

Referring to FIG. 1, shown is an example of an embodiment of a system that may be used in performing the techniques described herein. The system 10 includes a data storage system 12, such as a data storage array, connected to host systems 14a-14n through communication medium 18. In this embodiment of the system 10, the N hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be an intranet, network or other wireless or other hardwired connection(s) by which the host systems 14a-14n may access and communicate with the data storage system 12, and may also communicate with others included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particulars of the hardware and software included in each of the components that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols including, for example, network protocols, block-based protocols and file system-based protocols. For example, such protocols may include TCP/IP, SCSI (Small Computer Systems Interface), Fibre Channel, iSCSI, Fibre Channel over Ethernet, NVMe (Non-Volatile Memory Express) over Fabrics, and the like. Some or all of the connections by which the hosts and data storage system 12 may be connected to the communication medium 18 may pass through other communication devices, switching equipment that may exist such as a phone line, a repeater, a multiplexer or even a satellite.

Each of the host computer systems may perform different types of data operations in accordance with different types of administrative tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12. It should be noted that the data storage system 12 of FIG. 1 may physically be a single data storage system, as well one or more other data storage systems as may vary with the embodiment.

Referring to FIG. 2A, shown is an example of an embodiment of the data storage system 12 that may be included in the system 10 of FIG. 1. Included in the data storage system 12 of FIG. 2A are one or more data storage systems 20a-20n as may be manufactured by one or more different vendors. Each of the data storage systems 20a-20n may be interconnected (not shown). Additionally, the data storage systems may also be connected to the host systems through any one or more communication connections 31 that may vary with each particular embodiment and device in accordance with the different protocols used in a particular embodiment. The type of communication connection used may vary with certain system parameters and requirements, such as those related to bandwidth and throughput required in accordance with a rate of I/O requests as may be issued by the host computer systems, for example, to the data storage system 12. In this example as described in more detail in following paragraphs, reference is made to the more detailed view of element 20a. It should be noted that a similar more detailed description may also apply to any one or more of the other elements, such as 20n, but have been omitted for simplicity of explanation. It should also be noted that an embodiment may include data storage systems from one or more vendors. Each of 20a-20n may be resources included in an embodiment of the system 10 of FIG. 1 to provide storage services to, for example, host computer systems. It should be noted that the data storage system 12 may operate stand-alone, or may also be included as part of a storage area network (SAN) that includes, for example, other components.

Each of the data storage systems, such as 20a, may include a plurality of disk devices or volumes, such as the arrangement 24 consisting of n rows of disks or more generally, data storage devices, 24a-24n. In this arrangement, each row of disks may be connected to a disk adapter ("DA") or director responsible for the backend management of operations to and from a portion of the disks 24. In the system 20a, a single DA, such as 23a, may be responsible for the management of a row of disks, such as row 24a. In a data storage, a backend DA may also be referred to as a disk controller. The DA may perform operations such as reading data from, and writing data to, the physical devices which are serviced by the DA.

It should be noted that, more generally, the physical devices or data storage devices 24a-24n may be any suitable type of physical storage device or media, such as any form of suitable back-end non-volatile storage device. For example, physical devices included in an embodiment of a data storage system may include one or more types of rotating disk drives (e.g., SATA, SAS, FC 15K RPM, FC 10K RPM), one or more types of flash-based storage devices (e.g., SLC (single level cell) flash, MLC (multi-level cell) flash, TLC, (tri-level cell) flash) or more generally solid state drives (SSDs), and the like.

Also shown in the storage system 20a is an RA or remote adapter 40. The RA may be hardware including a processor used to facilitate communication between data storage systems, such as between two of the same or different types of data storage systems.

The system 20a may also include one or more host adapters ("HAs") or directors 21a-21n. Each of these HAs may be used to manage communications and data operations between one or more host systems and the global memory. In an embodiment, the HA may be a Fibre Channel Adapter (FA) or other adapter which facilitates host communication. Generally, directors may also be characterized as the different adapters, such as HAs (including FAs), DAs RAs and the like, as described herein. Components of the data storage system, such as an HA, which may communicate with a host (e.g., receive host I/O commands and send responses to the host) may also be referred to as front end components. A component of the data storage system which communicates with a front end component may be characterized as a backend component, such as a DA. In connection with data storage systems, various types of directors or adapters may be implemented as a processor, or, more generally, a component that includes the processor. Examples of directors are DAs, HAs, RAs, and the like, such as described herein.

One or more internal logical communication paths may exist between the DAs, the RAs, the HAs, and the memory 26. An embodiment, for example, may use one or more internal busses and/or communication modules. For example, the global memory portion 25b may be used to facilitate data transfers and other communications between the DAs, HAs and RAs in a data storage system. In one embodiment, the DAs 23a-23n may perform data operations using a cache that may be included in the global memory 25b, for example, in communications with other disk adapters or directors, and other components of the system 20a. The other portion 25a is that portion of memory that may be used in connection with other designations that may vary in accordance with each embodiment.

The particular data storage system as described in this embodiment, or a particular device thereof, such as a disk, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the disk drives of the storage systems directly, but rather access to data may be provided to one or more host systems from what the host systems view as a plurality of logical devices or logical units. A logical unit (LUN) may be characterized as a disk array or data storage system reference to an amount of disk space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives. For example, one or more LUNs may reside on a single physical disk drive. Data in a single storage system may be accessed by multiple hosts allowing the hosts to share the data residing therein. The HAs may be used in connection with communications between a data storage system and a host system. The RAs may be used in facilitating communications between two data storage systems. The DAs may be used in connection with facilitating communications to the associated disk drive(s) and LUN(s) residing thereon.

The DA physically accesses the back-end non-volatile storage devices, such as physical data storage devices (PDs) denoted by 24 of FIG. 2A. Data residing on a PD may be accessed by the DA following a data request in connection with I/O operations that other directors originate. In at least one embodiment, write data received at the data storage system from a host or other client may be initially written to cache memory (e.g., such as may be included in the component designated as 25b) and marked as write pending. Once written to cache, the host may be notified that the write operation has completed. At a later point time, the write data may be destaged from cache to the physical storage device, such as the non-volatile physical storage device (PDs of 24) accessed by a DA. In connection with reads, processing may include first looking to see if the requested read data is in cache whereby a read hit occurs. For a read hit, the read is serviced using the cached copy of the requested read data by returned the cached read data to the requester. Thus, with a read hit, there is no need to access the physical (back end) non-volatile storage by the DA to obtain the requested read data thereby resulting in a faster read I/O response time. If the requested read data is not in cache, the requested read data is obtained from the physical (back end) non-volatile storage by the DA where the read data is then stored in the cache, and returned to the requester. The cached copy of the read data may then be available to further service any other subsequent reads. As known in the art, any suitable cache management techniques may be used to maintain the cache, for example, such as is determining how long data remains in cache, whether to prefetch data, selecting data stored in the cache for eviction, and the like.

I/O response time may be characterized as the amount of time it takes the data storage system to perform or service an I/O operation from start to finish. Upon completion of the servicing, an acknowledgement regarding the I/O completion may be returned to the host or other client that issued the I/O operation. I/O response time may be measured from one or more component perspectives. I/O response time may be measured from the host perspective in which it may denote the amount of time that has lapsed from a starting point when the host issued the I/O operation to the data storage system to an ending point when the host received an acknowledgement from the data storage system. I/O response time may be measured from the data storage system perspective in which it may denote the amount of time that has lapsed from a starting point when the I/O operation is received at the data storage system to an ending point when the data storage system transmits an acknowledgement regarding I/O operation completion to the host.

Figure 2B:
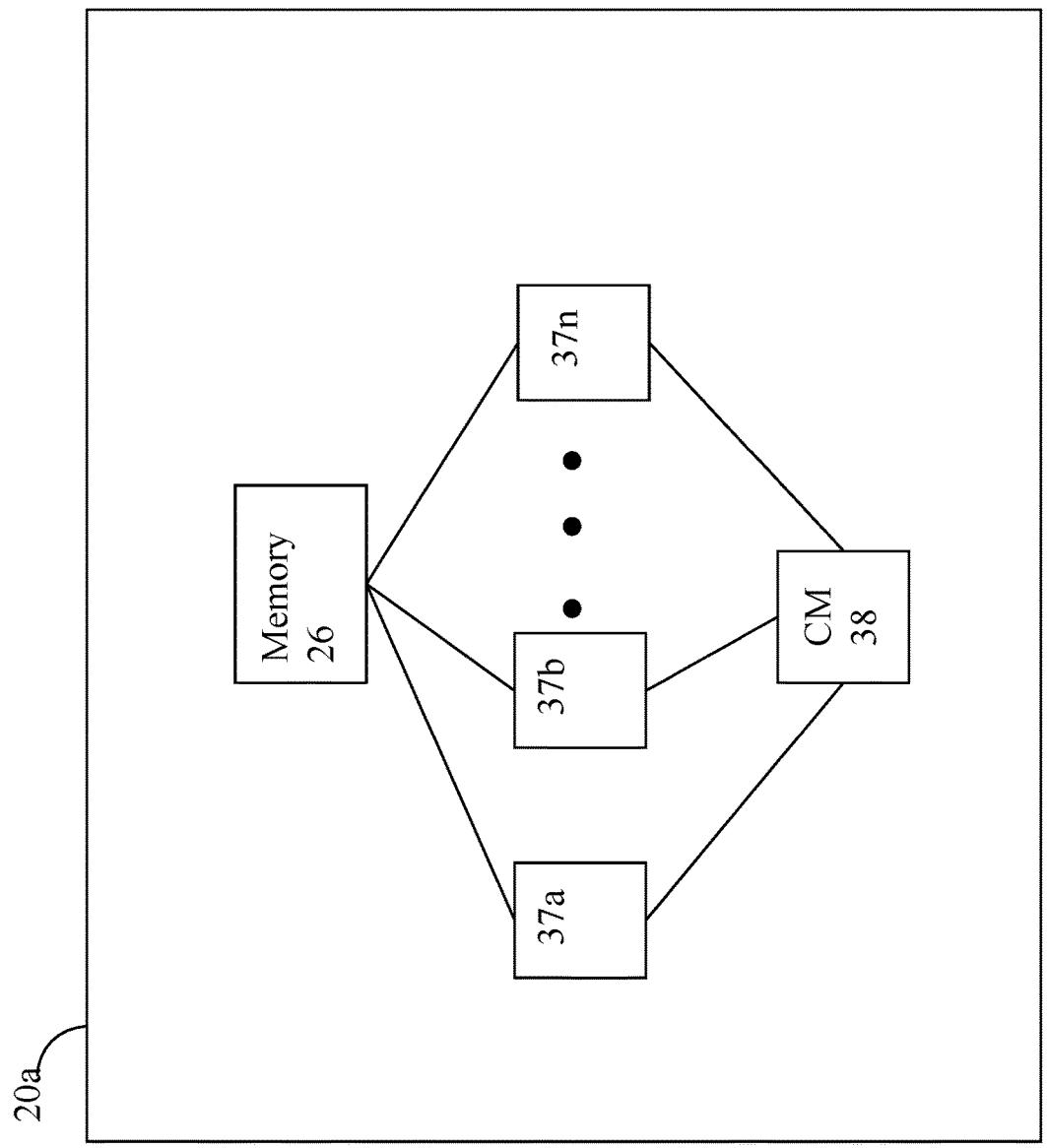
FIG. 2B is a representation of the logical internal communications between the directors and memory included in one embodiment of data storage system of FIG. 2A.

Referring to FIG. 2B, shown is a representation of the logical internal communications between the directors and memory included in a data storage system. Included in FIG. 2B is a plurality of directors 37a-37n coupled to the memory 26. Each of the directors 37a-37n represents one of the HAs, RAs, or DAs that may be included in a data storage system. Each of the directors may be, for example, a processor or a printed circuit board that includes a processor and other hardware components. The representation of FIG. 2B also includes an optional communication module (CM) 38 that provides an alternative communication path between the directors 37a-37n. Each of the directors 37a-37n may be coupled to the CM 38 so that any one of the directors 37a-37n may send a message and/or data to any other one of the directors 37a-37n without needing to go through the memory 26. The CM 38 may be implemented using conventional MUX/router technology where a sending one of the directors 37a-37n provides an appropriate address to cause a message and/or data to be received by an intended receiving one of the directors 37a-37n. In addition, a sending one of the directors 37a-37n may be able to broadcast a message to all of the other directors 37a-37n at the same time.

A host may be able to access data, such as stored on a LUN of a data storage system, using one or more different paths from the host to the data storage system. A data storage system device, such as a LUN, may be accessible over multiple paths between the host and data storage system as described in more detail below. Thus, a host may select one of possibly multiple paths over which to access data of a storage device.

It should be noted that the particular exemplary architecture of a data storage system such as, for example, in FIGS. 2A and 2B is merely illustrative of one such architecture that may be used in connection with techniques herein. Those skilled in the art will appreciate that techniques herein may be used with any suitable data storage system. For example, FIG. 2B provides an example of components that may be included in a separate physical fabric used for control communications sent between components of the data storage system. Some embodiments may use separate physical fabrics for each of data movement and control communications between data storage system components. Alternatively, some embodiments may use a same shared physical fabric for both data movement and control communication functionality rather than have a separate control communications fabric such as illustrated in FIG. 2B.

In an embodiment of a data storage system in accordance with techniques herein, components such as HAs, DAs, and the like may be implemented using one or more "cores" or processors each having their own memory used for communication between the different front end and back end components rather than utilize a global memory accessible to all storage processors.

It should be noted that although examples of techniques herein may be made with respect to a physical data storage system and its physical components (e.g., physical hardware for each HA, DA, HA port and the like), techniques herein may be performed in a physical data storage system including one or more emulated or virtualized components (e.g., emulated or virtualized ports, emulated or virtualized DAs or HAs), and also a virtualized or emulated data storage system including virtualized or emulated components.

The data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receiving a response (possibly including requested data) in connection such I/O commands.

The data path or I/O path may be contrasted with a control path. The data or I/O path and control path define two sets of different logical flow paths. The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. For example, with reference to the FIG. 1, the control commands may be issued from data storage management software executing on a management system connected to the data storage system 12. Such commands may be, for example, to establish or modify data services, provision storage, perform user account management, and the like. For example, commands may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

A data storage system may provide support for one or more types of logical devices or LUNs. The techniques herein may be used in an embodiment having thin or virtually provisioned logical devices. A thin logical device or LUN is a type of logical device where units of storage are progressively allocated on an as-needed basis. Typically, the base units of storage are provisioned from multiple sets of PDs organized as RAID groups, where these groups are partitioned into small portions sometimes referred to as slices. There is a mapping provided to relate the logical address in a thin device to the particular slice of provisioned storage. In a system using thin provisioning, the thin devices may appear to a host coupled to a data storage array as one or more logical volumes (logical devices) containing contiguous blocks of data storage. A thin device may be virtually provisioned in terms of its allocated physical storage where physical storage for a thin device (presented to a host as having a particular capacity) is allocated as needed rather than allocate physical storage for the entire thin device capacity upon creation of the thin device. As such, a thin device presented to the host as having a capacity with a corresponding LBA (logical block address) range may have portions of the LBA range for which storage is not allocated. In some embodiments, storage associated with a particular subrange of the logical address space of a thin device (where the subrange may be the size of a slice or chunk allocation unit) may be initially allocated in response to the first time there is write to the logical address subrange. Thin devices and thin provisioning are described in more detail in U.S. patent application Ser. No. 11/726,831, filed Mar. 23, 2007 (U.S. Patent App. Pub. No. 2009/0070541 A1), AUTOMATED INFORMATION LIFE-CYCLE MANAGEMENT WITH THIN PROVISIONING, Yochai, EMS-147US, and U.S. Pat. No. 7,949,637, Issued May 24, 2011, Storage Management for Fine Grained Tiered Storage with Thin Provisioning, to Burke, both of which are incorporated by reference herein.

An embodiment in accordance with techniques herein may provide for logical devices that are thin or virtually provisioned devices along with thick logical devices. A thick device or LUN may be characterized as a regular logical device presented as having a particular storage capacity where physical storage is provisioned (allocated or bound) for the entire storage capacity when the thick device is configured.

The data storage system may provide various data services. For example, in at least one embodiment in accordance with the techniques herein, a data storage system may provide one or more data reduction services in efforts to reduce the size of the stored data, for example, stored on the backend non-volatile storage PDs of the data storage system. In at least one embodiment, the data reduction services may include compression. The compression may be performed as a data storage service or operation inline as part of the I/O path or data path, as well as offline, where the compression operation is not performed as part of the I/O path or data path. When compression is performed inline, the compression of a data block, chunk or portion may be performed as part of the I/O path or data path when servicing I/O requests accessing the data block, chunk or portion. In contrast, compression of a data block may also be performed offline. For example, a data set may be written to backend PDs. At a later point in time, such as part of background processing, when the data set is offline/not in use, and the like, processing may be performed to read the data set, compress the data set, and then store the data set in its compressed form. Generally, compression techniques are known in the art and any one or more suitable such compression techniques may be used in an embodiment in accordance with techniques herein. In at least one embodiment, the compression techniques used may include one or more lossless compression techniques such as an algorithm from the Lempel Ziv algorithm family (e.g., LZ77, LZ78, LZW, LZR, and the like).

Compression may be performed by a compression engine comprising software and/or hardware of the data storage system. In some existing systems, the compression engine may assess or evaluate whether a data portion should be stored in compressed or uncompressed form.

It may be difficult to know or understand the apparent reduction capabilities of different compression techniques on a given data set without having actually performed compression of the data set. As such, described below are techniques that may be used to assess or estimate the data reduction that may be achieved for a given data set using different compression techniques. Host-based compression sampling of different data sets may be performed. In at least one embodiment, an I/O driver of the host may randomly sample different data sets and different compression techniques to assess the expected compression ratio achieved for the different combinations of data sets and compression techniques.

A compression ratio may denote a measure of the size of an original uncompressed data chunk with respect to the size of the compressed form of the data chunk. For example, if compression processing compresses a 10 MB file to 2 MB, the file has a compression ratio of 10/2=5, often notated as an explicit ratio, 5:1 (read "five" to "one"), or as an implicit ratio, 5/1.

In at least one embodiment, an average compression ratio over time may be a metric measured for each combination of a data set and a particular compression technique. In this manner, the host may perform periodic sampling of portions of the data sets to determine expected or predicted compression ratios for the data sets. The host may build a table of the different compression ratios observed for the different combinations of data sets and compression techniques. The host may then send the table, in the form of hint information regarding compression, to the data storage system for use in selecting the particular compression technique to use for each of the different data sets. The data storage system may further send the table to another larger collection site, such as an Internet site including a database storing multiple tables reported from multiple data storage systems and customers. The information in the database may then be analyzed and used in rating or ranking different compression techniques based on the compression ratios expected for the different compression techniques for multiple types of data sets. The information may be used to determine compression tiers of different compression techniques such as a basic tier and a premium tier, wherein compression techniques in the premium tier are expected to achieve higher compression ratios that other compression techniques in the basic tier. If a particular customer's data sets do achieve a sufficient higher compression rate (e.g., based on a defined threshold) using the premium tier compression techniques as compared to compression rates achieved with the lower basic tier, then a recommendation may be made to the customer to upgrade from the basic to the premium tier.

In at least one embodiment, data reduction hardware may be customized to implement one or more selected compression techniques using a separate hardware (HW) device or component. Generally, for multiple data storage customers and multiple types of data sets, a first compression technique may achieve a first compression ratio and a second different compression technique may achieve a second compression ratio that is higher/better than the first compression ratio. The first compression technique may be included in a basic tier and the second compression technique may be included in the premium tier. A first HW device or component may implement, for example, using hardware accelerators, the first compression technique expected to achieve the first compression ratio across a variety of different customer data sets. The first HW device or component may be characterized as a basic HW device or component. A second HW device or component may implement, for example, using hardware accelerators, the second compression technique expected to achieve the second compression ratio across a variety of different customer data sets. In at least one embodiment, the first HW device or component may be characterized as a basic but upgradable HW device or component. The second HW device or component may considered a premium component delivering greater compression ratios for the same data sets than the first HW device or component. The functionality of the first HW device or component may be extended or upgraded to that of the second HW device or component. For example, the first HW device or component may be included in a first PCI card (e.g., printed circuit board) and the second HW device or component may be included in a second PCI card. The second PCI card may be a mezzanine card that plugs directly into the first PCI card in order to extend and upgrade the functionality of the first PCI card. As yet another variation, a third HW device or component may be customized for a particular customer based on the particular data sets of that particular customer. The third HW device or component may implement, using hardware accelerators, a particular compression technique expected to achieve the highest compression for that particular customers' data sets. The third HW device or component may be included in a third PCI card. The third PCI card may be a mezzanine card that plugs directly into the first PCI card and/or the second PCI card in order to extend the functionality of such cards.

In connection with compression ratios measured herein and specified for the different tiers of compression algorithms, the compression ratios may be approximately (e.g., within specified tolerances) specified. For example, the first tier of compression algorithms may be determined to have a 2:1 compression ratio for at least a specified percentage or number of data sets, where the compression ratio of 2:1 may be approximate.

More generally, the HW components or devices implementing the compression algorithms in HW in an embodiment in accordance with the techniques herein may be implemented using any suitable HW. For example, in at least one embodiment, each of the HW devices or components may be an ASIC (application specific integrated circuit).

In at least one embodiment, the first and second HW devices or components noted above, may be included in the same card where functionality of one or both HW devices may be enabled or disabled depending on currently installed licenses on a particular data storage system. More generally, an embodiment may enable or disable compression processing using one or more HW devices depending on currently installed licenses on a particular data storage system. In a multi-tenant data storage system environment or cloud-based environment in which multiple customers' or clients' data sets may be stored on the same data storage system, an embodiment may enable or disable compression processing using one or more HW devices depending on currently installed licenses for particular customers or clients as well as for particular data sets. In this latter instance, the embodiment provides for enabling different HW devices based on licensing per customer, per customer data set, as well as any other suitable level of granularity of licensing. In this manner, licensing may be used to define the set of compression techniques and HW devices available from which a particular compression technique may be selected for use with a particular data set based on the hint information provided by the host. For example, even though a customer's data set may be expected to achieve higher compression ratio using a compression technique implemented using the second HW device ("premium") or third HW device ("customized") noted above than another compression technique implemented using the first HW device having "basic" compression functionality, if that particular customer or that particular data set is only licensed to use the "basic" compression techniques of the first HW device, then the data storage system will select from only the compression techniques implemented using the first HW device. In order to select from the premium or customized compression techniques, respectively, of the second HW device and third HW device, the customer and/or data set must be accordingly licensed.

In at least one embodiment, one or more of the HW devices each providing a different tier of compression algorithms may be included in a single card that may be included in a system. More generally, multiple such HW devices may be included in any number of one or more cards included in a system.

The foregoing and other aspects of the techniques herein are described in more detail in following paragraphs and figures.

A data set as used herein refers to any specified set of data or storage objects stored on the data storage system and for which compression is performed. A data set may be defined in terms of physical and/or logical storage entities or objects supported in a data storage system for storing user data. For example, a data set may be defined in terms of file-based storage entities such as files, directories, file systems, and the like. A data set may also be specified in terms of block-based storage entities such as one or more LUNs or a storage group that is a logically defined group of one or more LUNs. A data set may also be a sub-LUN portion or less than an entire LUN, sub-LUN portions of multiple LUNs, all storage entities accessed by a particular host or application, and the like. In following paragraphs and example, a particular data set, such as a LUN, may be used for purposes of illustration of the techniques herein. However, more generally, the techniques herein may be used with any suitable data set.

Figure 3:
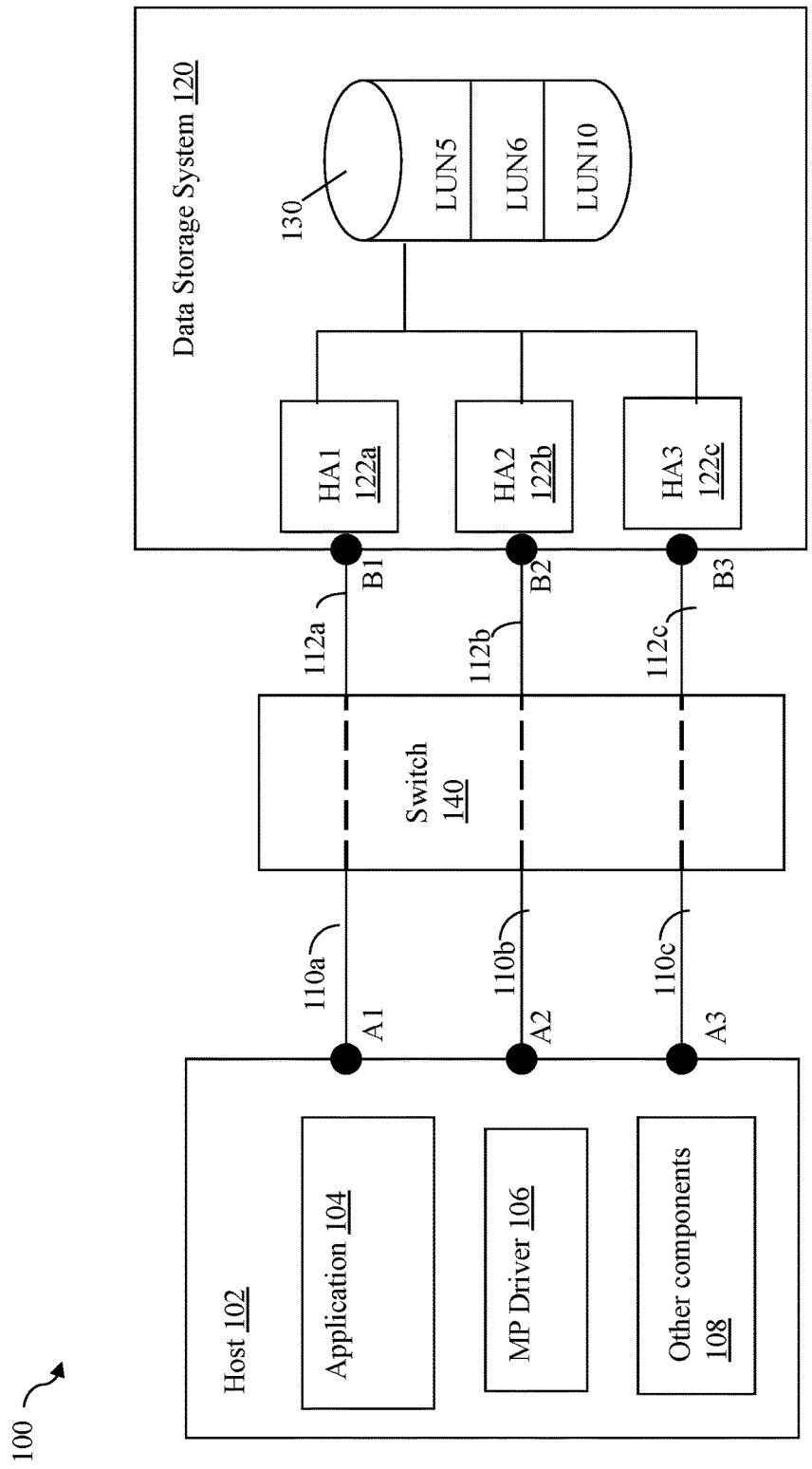
FIGS. 3, 5, 7, 8, 9 and 13 are examples of systems, components and information that may be used in connection with the techniques herein.

Referring to FIG. 3, shown is an example of an embodiment of a system that may be utilized in connection with the techniques herein. The example 100 includes a host 102, switch 140 and data storage system 120. The host 102 and data storage system 120 may communicate over one or more paths through the switch 140. Elements 110a-110c denote connections between the host 102 and switch 140. Element 112a-112c denote connections between the data storage system 120 and the switch 140. Element 130 may represent a physical device of the data storage system 120 where the physical device 130 may be configured to include 3 LUNs—LUN5, LUN6 and LUN10. It should be noted that the example 100 includes only a single host, single physical device 130 with 3 LUNs, a single data storage system, and a fabric including a single switch for purposes of simplicity to illustrate the techniques herein.

The host 102 may include an application 104, a multi-path (MP) driver 106 and other components 108 whereby element 108 may also include one or more other device drivers and other code. An I/O operation from the application 104 may be communicated to the data storage system 120 using the MP driver 106 and one or more other components represented by element 108. The application 104 may be a database or other application which issues data operations, such as I/O operations, to the data storage system 120.

Each of the I/O operations may be directed to a device, such as one of the LUNs of device 130, configured to be accessible to the host 102 over multiple physical paths. As such, each of the I/O operations may be forwarded from the application 104 to the data storage system 120 over one of the possible multiple paths. The MP driver 106 may include functionality to perform any one or more different types of processing such as related to encryption, multipathing, mirroring, migration, and the like. For example, the MP driver 106 may include multipathing functionality for management and use of multiple paths. For example, the MP driver 106 may perform path selection to select one of the possible multiple paths based on one or more criteria such as load balancing to distribute I/O requests for a LUN device across available active paths. Load balancing may be performed to provide for better resource utilization and increased performance of the host, data storage system, and network or other connection infrastructure. The MP driver 106 may be included in a commercially available product such as, for example, Dell® EMC PowerPath® software by Dell Inc. The host 102 may also include other components 108 such as one or more other layers of software used in connection with communicating the I/O operation from the host to the data storage system 120. For example, element 108 may include Fibre Channel or SCSI drivers, a logical volume manager (LVM), and the like. It should be noted that element 108 may include software or other components used when sending an I/O operation from the application 104 where such components include those invoked in the call stack above the MP driver 106 and also below the MP driver 106. For example, application 104 may issue an I/O operation which is communicated in a call stack including an LVM, the MP driver 106, and an FC or SCSI driver. This is described in more detail below such as with a subsequent figure.

The data storage system 120 may include one or more physical data storage devices, such as device 130, where each such physical device may be configured to store data of one or more LUNs as described above. Each of the LUNs having data stored on the device 130 may be configured to be accessible to the host through multiple paths. For example, all LUNs of 130 may be accessible using ports of the three front end directors or interfaces 122a-122c, also denoted respectively HA1, HA2 and HA3. The multiple paths allow the application I/Os to be routed over multiple paths and, more generally, allow the LUNs of device 130 to be accessed over multiple paths. In the event that there is a component failure in one of the multiple paths, application I/Os can be easily routed over other alternate paths unaffected by the component failure. Thus, an embodiment of the MP driver 106 may also perform other processing in addition to load balancing in connection with path selection. The MP driver 106 may be aware of, and may monitor, all paths between the host and the LUNs of the device 130 in order to determine that particular state of such paths with respect to the various LUNs. In this manner, the MP driver may determine which of the multiple paths over which a LUN is visible may be used for issuing I/O operations successfully, and to use such information to select a path for host-data storage system communications issued to a particular LUN.

In the example 100, each of the LUNs of the device 130 may be configured as accessible through three paths. Each path may be represented by two path endpoints—a first endpoint on the host 102 and a second endpoint on the data storage system 120. The first endpoint may correspond to a port of a host component, such as a host bus adapter (HBA) of the host 102, and the second endpoint may correspond to a port of a data storage system component, such as a port of an HA of the data storage system 120. In the example 100, elements A1, A2 and A3 each denote a port of a host 102 (e.g. such as a port of an HBA), and elements B1, B2 and B3 each denote a target port of an HA of the data storage system 120. Each of the LUNs of the device 130 may be accessible over three paths—a first path represented by A1-B1, a second path represented by A2-B2 and a third path represented by A3-B3.

Figure 4:
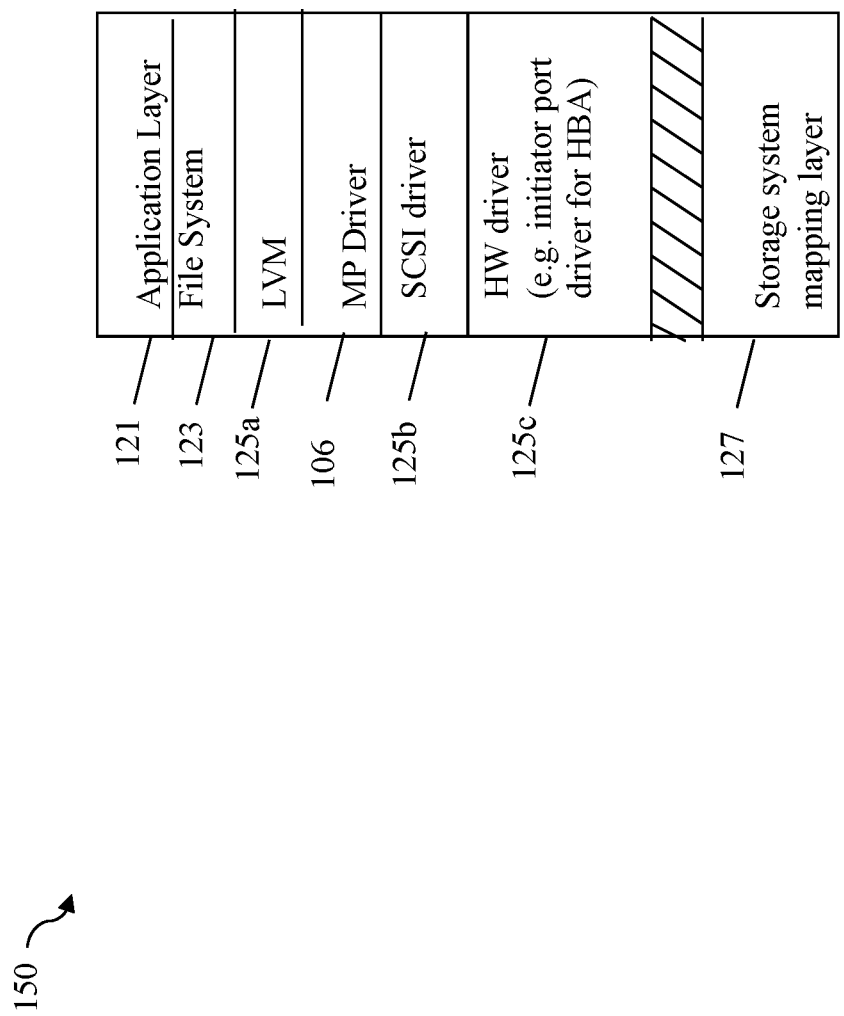
FIG. 4 is an example of different software layers that may be included in a host and data storage system in an embodiment in accordance with the techniques herein.

Referring to FIG. 4, shown is a representation of a number of mapping layers that may be included in a computer system, such as host 102 of FIG. 3, in combination with a data storage system. FIG. 4 provides further detail regarding various software layers that may be used in connection with the MP driver 106 of FIG. 3.

In an embodiment in accordance with techniques herein, the data storage system as generally described may be characterized as having one or more logical mapping layers in which a logical device or LUN of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

The various software layers of 150 may generally form layers included in the runtime I/O stack, such as when an I/O request is issued by an application on a host to a data storage system. The system includes an application layer 121 which includes application programs executing on the host computer 102. The application layer 121 may refer to storage locations using an associated label or identifier such as a file name or file identifier. Below the application layer 121 is the file system layer 123 and the LVM layer 125a that maps the label or identifier specified by the application layer 121 to a LUN which the host may perceive as corresponding to a physical device address (e.g., the address of one of the disk drives) within the storage system 12. Below the LVM layer 125a may be the MP (multipath) driver 106 which handles processing of the I/O received from layer 125a. The MP driver 106 may include a base driver and one or more driver extension modules. The MP driver 106 may be included in a commercially available product such as Dell® EMC PowerPath® software. Functionality for performing multipathing operations by multipathing software, such as the MP driver 106, may be included in one of the driver extension modules such as a multipath extension module. As described above, the MP driver may perform processing in connection with multiple path management and selecting one of a plurality of possible paths for use in connection with processing I/O operations and communicating with the data storage system, such as 120 of FIG. 3. More generally, one or more layers between the application layer 121 and the MP driver 106 may provide for mapping a LUN (such as used in connection with block-based storage) presented by the data storage system to the host to another logical data storage entity, such as a file, that may be used by the application layer 123. Below the MP driver 106 may be the SCSI driver 125b and a hardware (HW) driver 125c. The SCSI driver 125b may handle processing of a received I/O request from the MP driver 106 such as related to forming a request in accordance with the SCSI standard. The driver 125c may be a HW driver that facilitates communication with hardware on the host. The driver 125c may be, for example, a driver for an HBA of the host which sends commands or requests to the data storage system and also receives responses and other communications from the data storage system.

In some embodiments, the data storage system 120 may be an intelligent data storage system having its own mapping layer 127 such that the LUN known or exposed to the host may not directly correspond to a physical device such as a disk drive. In such embodiments, the LUN provided by the host in connection with the I/O operation may be further mapped by the data storage system using its mapping layer 127. For example, a LUN provided by the host may be mapped by the data storage system to one or more physical drives, multiple LUNs may be located on a same physical device, multiple physical drives, and the like. In other embodiments, the data storage system may not include such a mapping layer 127.

The MP driver 106, as well as other components illustrated in FIG. 4A, may execute in kernel mode or other privileged execution mode. In one embodiment using a Unix-based operating system, the MP driver 106 may execute in kernel mode. In contrast, an application such as represented by application layer 121 may typically execute in user mode, or more generally, a non-privileged execution mode. Furthermore, it will be appreciated by those skilled in the art that the techniques herein may be used in an embodiment having any one of a variety of different suitable operating systems including a Unix-based operating system as mentioned above, any one of the Microsoft Windows® operating systems, a virtualized environment, such as using the VMware™ ESX hypervisor by VMware, Inc, and the like.

In operation, an application executing at application layer 121 may issue one or more I/O operations (e.g., read and write commands or operations) to logical volumes (implemented by the LVM 125a) or files (implemented using the file system 123) whereby such I/O operation may be then mapped to data operations directed to LUNs of the data storage system. Such I/O operations from the application layer 121 may be directed to the MP driver 106 after passing through any intervening layers such as layers 123 and 125a. It should be noted that, in some embodiments, the MP driver 106 may also be below the SCSI driver 125b.

In connection with the SCSI standard, a path may be defined between two ports as described above. A command may be sent from the host (as well as a component thereof such as a host bus adapter) and may be characterized as an initiator, originator or source with respect to the foregoing path. The host, as the initiator, sends requests to a data storage system (as well as a particular component thereof such as another HA having a port with a network address) characterized as a target, destination, receiver, or responder. Each physical connection of a path may be between a first endpoint which is a port of the host (e.g., such as of a host bus adapter having ports such as denoted as A1-A3 of FIG. 3) and a second endpoint which is a port of an HA (e.g., such as B1-B3 of FIG. 3) in the data storage system. Over each such path, one or more LUNs may be visible or exposed to the host initiator through the target port of the data storage system.

An I/O command or operation, such as a read or write operation, from the host to the data storage system may be directed to a LUN and a logical address or location in the LUN's logical address space. The logical address or location of the LUN may be characterized as the target logical address of the I/O operation. The target logical address or location of the I/O operation may identify an LBA within the defined logical address space of the LUN. The I/O command may include various information such as identify the particular type of I/O command as read or write, identify the target logical address (e.g., LUN and LUN logical address) of the I/O command, and other information. In connection with servicing the I/O operation, the data storage system may map the target logical address to a physical storage location on a PD of the data storage system. The physical storage location may denote the physical storage allocated or provisioned and also mapped to the target logical address.

Figure 5:
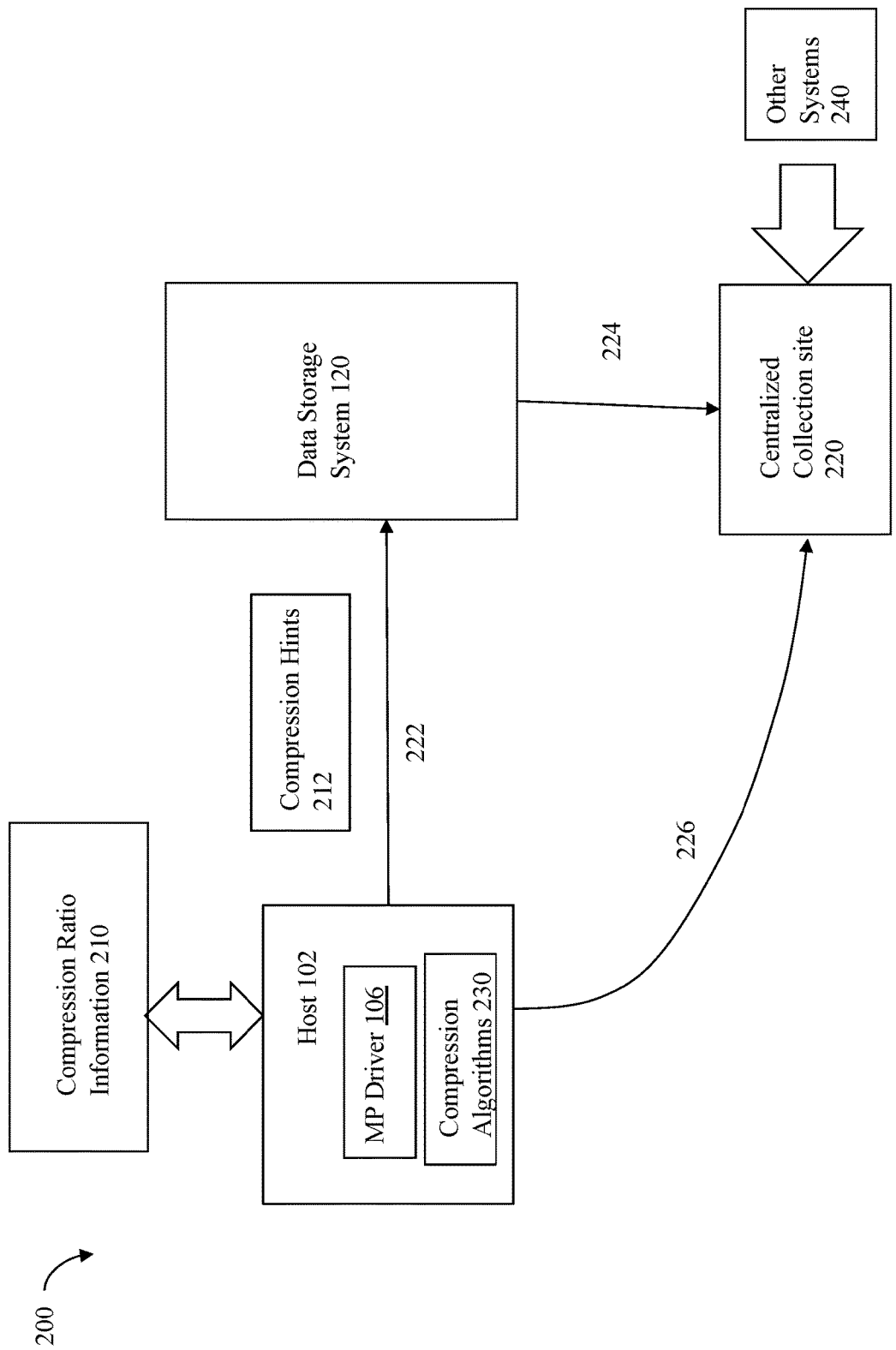

Referring to FIG. 5, shown is an example of components that may be included in an embodiment in accordance with the techniques herein. The example 200 includes the host 102, MP driver 106, and the data storage system 120 as described above. Element 230 denotes the set of compression techniques or algorithms to be evaluated for different data sets. The compression techniques or algorithms 230 may be implemented using software, for example, that is executed on the host. The MP driver 106 may collect compression ratio information 210 for each data set, such as each LUN, to which I/Os are directed. In at least one embodiment, for I/Os directed to each LUN, the MP driver may determine an average compression ratio for each of the different compression techniques or algorithms 230. The MP driver 106 may randomly select I/Os directed to each of the LUNs for sampling to determine the compression ratios for the various compression techniques. For example, for write I/Os directed to a LUN that are selected for compression sampling, the data written (e.g., transmitted to the data storage system 120 from the host 102) may be compressed using each of the compression algorithms 210. For read I/Os directed to a LUN that are selected for compression sampling, the data read (e.g., returned from the data storage system 120 to the host 102) may be compressed using each of the compression algorithms 210. In at least one embodiment, every Nth I/O operation directed to a LUN may be selected for sampling where N is any suitable positive integer. For example, in at least one embodiment, N may be as small as 10 or as large as 100.

Referring to FIG. 6, shown is a table 300 of compression ratio information that may be collected by the MP driver 106 in an embodiment in accordance with the techniques herein. The example 300 provides more detail of what may be included in the compression ratio information 210 of FIG. 5 in at least one embodiment.

The table 300 includes 5 columns of information: LUN ID (identifier) 302, compression algorithm 304, compression ratio 306, total TBs (terabytes) of data sampled 308, and total time 310. Each row of the table 300 provides information collected for a particular unique combination of LUN ID 302 and compression algorithm 304. The total TBs of data sampled 308 may denote the collective total of data that has been compressed for a particular combination of LUN ID and compression algorithm in a row. The compression ratio 306 may denote an average compression ratio achieved with respect to the total TBs of data sampled 308 in a row. The total time 310 may denote the total CPU or execution time to perform compression for the total TBs of data sampled 308 in a row. For example, row 320 indicates that as a result of compressing 33 TBs (column 308) of data for I/Os directed to LUN 100 (column 302) using the compression algorithm A1 (column 304), a compression ratio of 2:1 (column 306) is achieved. Furthermore, the total CPU execution time to perform the compression denoted by row 320 is 2572 hours.

Row 322 indicates that as a result of compressing 22 TBs (column 308) of data for I/Os directed to LUN 100 (column 302) using the compression algorithm B1 (column 304), a compression ratio of 3:1 (column 306) is achieved. Furthermore, the total CPU execution time to perform the compression denoted by row 322 is 2600 hours.

Row 324 indicates that as a result of compressing 35 TBs (column 308) of data for I/Os directed to LUN 200 (column 302) using the compression algorithm A1 (column 304), a compression ratio of 1:1 (column 306) is achieved. Furthermore, the total CPU execution time to perform the compression denoted by row 324 is 2572 hours.

Row 326 indicates that as a result of compressing 12 TBs (column 308) of data for I/Os directed to LUN 200 (column 302) using the compression algorithm B1 (column 304), a compression ratio of 9:1 (column 306) is achieved. Furthermore, the total CPU execution time to perform the compression denoted by row 320 is 2400 hours.

Referring back to FIG. 5, the MP driver 106 may perform processing to randomly select I/Os for which the associated data is compressed using the different compression algorithms 230. In at least one embodiment, the compression processing performed on the host to obtain the compression ratio information 210 may be executed with lower priority relative to other processing, such as processing performed by an application executing on the host 102. The compression processing may be performed, for example, during time periods when the host 102 is not heavily utilized (e.g. when the host's CPU utilization is below a specified maximum threshold, or as a background task). In at least one embodiment, the table of compression ratio information 300 may be gathered out of band with respect to the I/O path so that it minimizes adverse impact to the I/O response times.

Periodically, the compression ratio information 210 may be sent, in the form of compression hints 212, to the data storage system 120 over connection 222. The compression hints 212 may be forwarded periodically by the host to the data storage system, or the data storage system may periodically request the compression hints 212 from the host.

The data storage system 120 may act as a proxy and then further forward the compression hints 212, over the connection 224, to the centralized collection site 220. As an alternative or in addition to the foregoing, the compression hints 212 may be directly transmitted from the host 102 over connection 226 to the centralized collection site 220. In this latter case, the host may periodically forward the compression hints to the site 220, or the site 220 may periodically request and collect the compression hints 212 from the host.

The centralized collection site 220 may be generally characterized as another website or other network location which serves as a collective data depository of the multiple sets of compression hints 212 received over time from the data storage system 120 as well as other systems 240. Element 240 may include other data storage systems as well as other hosts to generally denote that other compression hint information is also sent to the centralized collection site 220 from other systems for other customers and users. The collective compression hints in the centralized collection site 220 may be used to collectively perform data analysis regarding achieved compression ratios for different compression algorithms across multiple data storage customers and systems. The collective compression hints in the centralized collection site 220 may be used to also perform data analysis regarding achieved compression ratios for different compression algorithms for individual data storage systems, a group of data storage systems, individual customers having multiple data sets on one or more data storage system, and individual data sets.

In at least one embodiment, the collective compression hints received for multiple data sets and multiple data storage systems over a defined time period may be used to select particular compression algorithms that are implemented using hardware (HW) in a HW device or component. In other words, the collective compression hints may be used in product development to discover the particular compression algorithms that achieve or meet specified criteria in order to select the particular compression techniques for incorporation in a particular HW device. For example, in at least one embodiment, the collective compression hints may be used to select a first set of compression algorithms that achieve specified criteria including a specified compression ratio, such as approximately 3:1 (e.g., within specified tolerances or limits) for at least a specified percentage, such as 80%, of the data sampled. Rather than specify a single compression ratio for criteria to be included in the first set, a range of compression ratios may be specified (e.g., from 2:1 to 3:1). Furthermore, the criteria for selecting a compression algorithm for the first set may also meet specified time requirements or conditions. For example, the measured compression throughput or rate based on the total TBs sampled 308 and total time 310 may be within specified limits. The foregoing may be used to determine a basic tier of compression algorithms meeting basic tier criteria.

Generally, an embodiment may define a different set of criteria for each desired tier of compression algorithms implemented in HW. For example, in at least one embodiment a first set of criteria may be specified for a basic tier, as noted above. Additionally, a second set of criteria may be specified for a premium tier. The premium tier may be characterized as including compression techniques that result in higher compression ratios than those of the basic tier. For example, in at least one embodiment, the collective compression hints may be used to select a second set of compression algorithms that achieve specified criteria including a specified compression ratio, such as at least 5:1 for at least a specified percentage, such as 50% or 60%, of the data sampled. Rather than specify a single compression ratio for criteria to be included in the second set, a range of compression ratios may be specified (e.g., from 4:1 to 5:1, or from 3:1 to 5:1). In a similar manner, an embodiment may also define other tiers of compression algorithms implemented in HW.

For purposes of illustration, consider an embodiment in which a basic tier of compression algorithms is identified and also a premium tier of compression algorithms is identified. Generally, as noted above, the premium tier compression algorithms are expected to achieve higher compression ratios than compression algorithms of the basic tier. In this case, a first HW device or component may be made that implements the compression algorithms of the basic tier in HW and a second HW device or component may be made that implements the compression algorithms of the premium tier in HW.

As such, the first HW device and the second HW device may provide a more cost-effective and flexible approach to perform compression and decompression. In at least one embodiment, each of the HW devices may include one or more processors, memory and other components that provides one or more data operations or services, such as part of the I/O data path or runtime stack with respect to data stored on PDs of the data storage system. For example, the HW devices may characterized as dedicated HW devices that perform only compression and decompression. The HW devices may be used to off-load processing (e.g., from the one or more data storage system CPUs to the co-processors of the HW device) performed in connection with compression and decompression of data stored on PDs of the data storage system. In one aspect, the HW devices may be characterized as having a special or designated purpose to perform only the specified data related services, such as only compression/decompression. For example, in at least one embodiment, the HW devices may only perform processing for compression/decompression. Generally, the HW devices are connected to at least one CPU of the data storage system. For example, each of the HW devices may be a chipset on a plug-in card or an or an ASIC that connects to a CPU of the data storage system. As another example, the HW device may be implemented as a SoC (system on a chip) that connects to a CPU of the data storage system via on-chip interconnections. In at least one embodiment, the HW devices may include hardware-based accelerators that perform compression and decompression processing.

Figure 7:
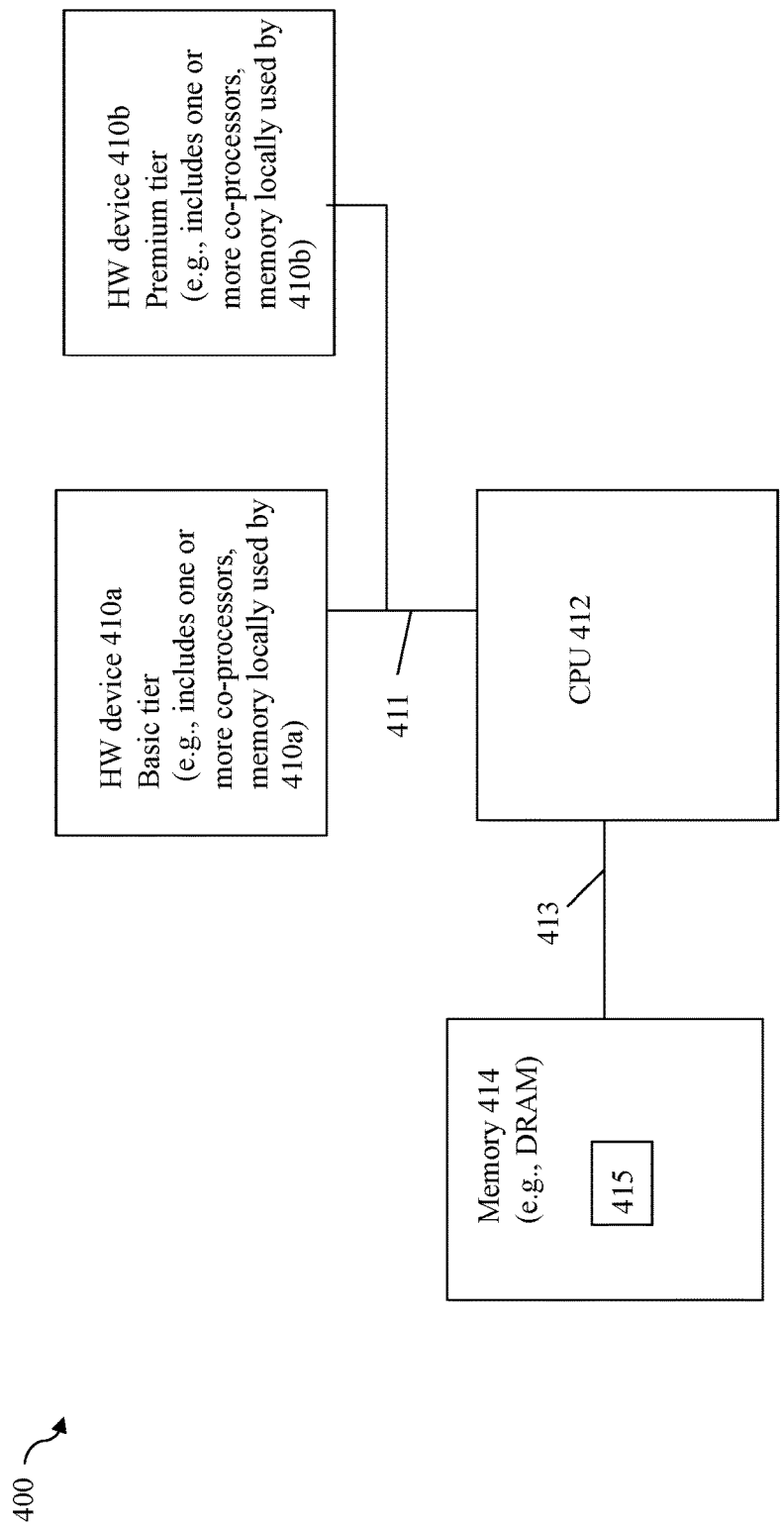

Referring to FIG. 7, shown is an example of components that may be included in an embodiment in accordance with techniques herein. The example 400 includes HW devices 410a-b, CPU 412 and memory 414. The HW device 410a may be, for example, the first HW device described above implementing the basic tier of compression algorithms. The HW device 410b may be, for example, the second HW device described above implementing the premium tier of compression algorithms.

The CPU 412 may be, for example, a data storage system processor. The memory 414 may be, for example DRAM used as a portion of cache memory of the data storage system. Element 411 is a connection between the HW devices 410a-b and the CPU 412 and used for communications therebetween. Element 413 is a connection between the CPU 412 and the memory 414 and used for communications therebetween. Elements 411 and 413 may be each be a bus or other suitable communication connection or fabric.

In at least one embodiment in accordance with techniques herein, the data storage system allocates a portion 415 of memory 414 and stores the data to be compressed or decompressed in the allocated memory portion 415 of 414. The data in memory portion 415 may then be transmitted to a selected one of the HW devices 410a or 410b for compression. In at least one embodiment, the selected one of the HW devices 410a or 410b may perform a DMA operation to access 415 of memory 414 and obtain the data as input for processing, such as compression or decompression. The selected one of the HW devices 410a or 410b may store the input in a buffer or memory that is locally used only by the selected HW device. After performing the requested processing operation of compression or decompression, the selected HW device 410a or 410b may perform a DMA operation to store the resulting transformed data in the memory portion 415.

The selected one of the HW devices 410a or 410b may be informed regarding the pending data in 415 in any suitable manner. For example, the selected HW device may be signaled via interrupt that there is pending data in 415. In a similar manner, the CPU 412 may be notified regarding the resulting transformed data stored in 415 in any suitable manner. For example, the CPU 412 may be signaled via interrupt that there is a pending response including data in 415.

As described herein in at least one embodiment, the HW devices 410a and 410b may include any suitable component(s) (e.g., co-processors, local memory to 410, etc.) capable of performing the offloading processing of compression and decompression as described herein.

Additionally, it should be noted that although only a single CPU 412 and its associated memory 414 and connection 413 are illustrated in FIG. 7, an embodiment in accordance with techniques herein may have multiple instances of the foregoing (e.g., multiple CPUs connected to the HW devices 410 rather than just 1 CPU as in FIG. 7) where multiple CPUs may be connected to, and issue requests to, the HW devices 410a and 410b.

The example 400 of FIG. 7 illustrates an embodiment including both the HW devices or components 410a and 410b implementing, respectively, the basic tier of compression algorithms and the premium tier of compression algorithms. As a variation, an embodiment may include only the HW device 410a or only the HW device 410b. In at least one embodiment in which the data storage system includes only the HW device 410a at a first point in time, the data storage system may be upgraded at a later point in time to also includes the HW device 410b.

In an embodiment in which the data storage system at the first point in time only includes HW device 410a but not 410b, processing may be performed using compression hints collected over time for the data storage system. For example, the data storage system may, through a UI of a management application, provide information to the user indicating the compression ratio improvement that may be expected if compression were performed using a particular algorithm of the premium tier performed by HW device 410b. In this manner, the user may be informed of a current first compression ratio observed based on compression hints obtained using compression algorithms of the basic tier as gathered by the host 102. The user may also be informed of a current second compression ratio observed based on compression hints obtained using compression algorithms of the premium tier as also gathered by the host 102. The first compression ratio and second compression ratio may be based on the host sampling of data performed with respect to data stored on the data storage system for the particular customer. Based on the foregoing, the management application may make recommendation to the user via the UI to purchase the HW device 410*b*, for example, if the second compression ratio is at least a specified minimum threshold, or if the second compression ratio is at least a specified minimum amount of improvement in compression with respect to the first compression ratio.

Figure 8:
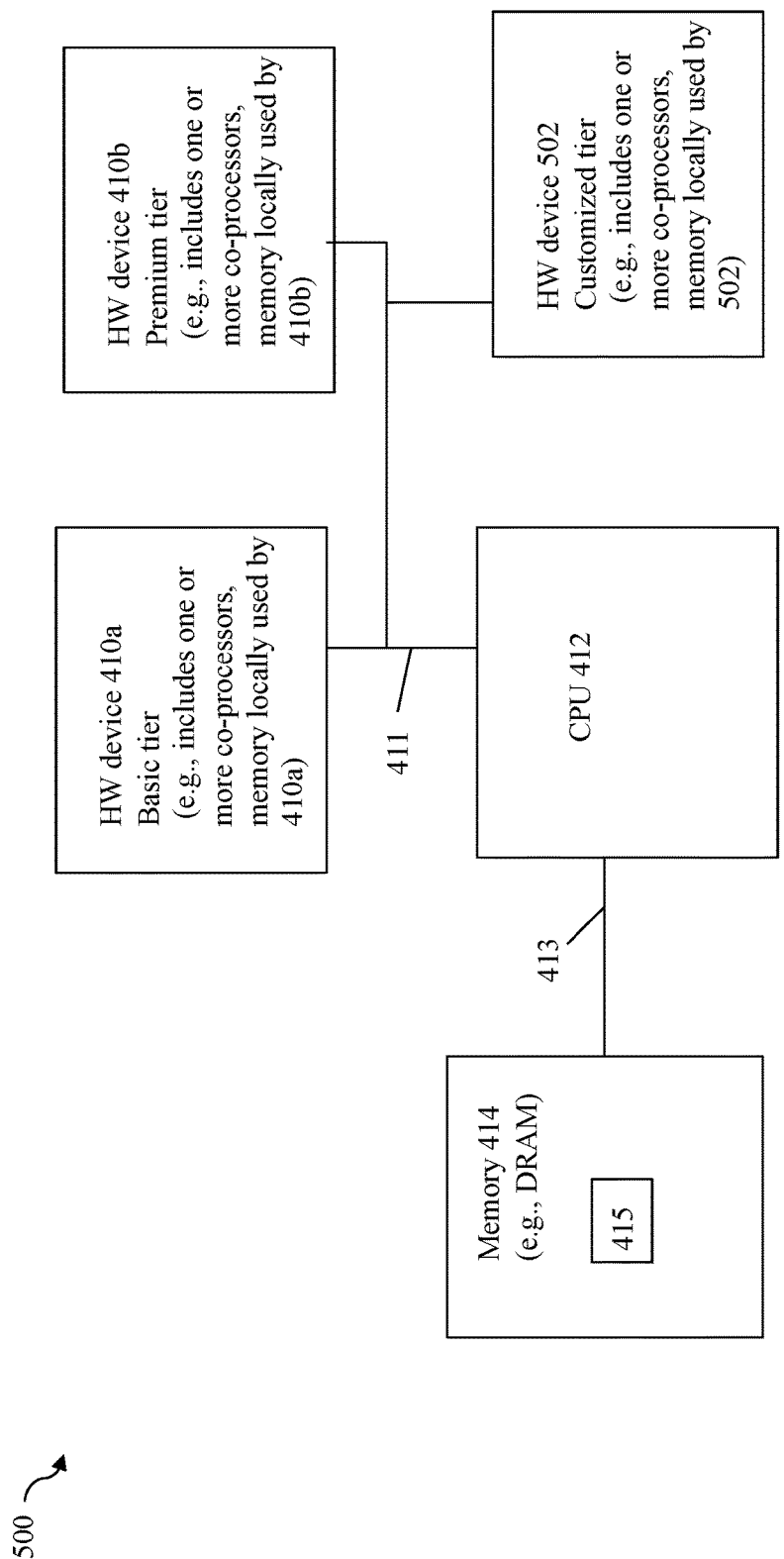

Referring to FIG. 8, shown is another example of components that may be included in an embodiment in accordance with the techniques herein. The example 500 includes the same components similarly number as in the example 400 with the difference that the example 500 further includes the HW device 502. The HW device 502 may be similar to the HW device 410*a*, 410*b* with the difference that the HW device 502 implements a third set of compression algorithms that are customized for use with the particular data storage system. The third set of compression algorithms may form a customized tier of compression algorithms selected for optimizing compression on the particular data stored on the single data storage system including the HW device 502. The compression hints collected by a host may issue I/Os to a particular data storage system where the compression hints provide information regarding data of the I/Os directed to the particular data storage system. The compression hints may be analyzed to determine which compression techniques for data stored on the particular data storage system result in the highest compression ratios (e.g., best data reduction via compression). In this manner, compression algorithms may be selected that are customized to maximum data compression for the particular data storage system. The selected compression algorithms may then be implemented by the HW device 502.

As a variation, the HW device 502 implementing a customized tier of compression algorithms may also be determined for one or more particular data sets of the customer having the data storage system. For example, it may be that the customer or user of the data storage system indicates that maximum compression need to achieved for only a portion of the data sets stored on the data storage system. In this case, the compression algorithms selected may be based on those compression algorithms that achieve the best compression ratios for the particular designated data sets.

As a variation, the customized tier of compression algorithms implemented by the HW device 502 may be customized for a particular type of data used by multiple customers or data storage systems. For example, the customized tier may be customized and achieve the highest measured compression ratios of all algorithms tested by the host for data of a particular application (e.g., particular database application used by multiple customers, particular email application used by multiple customers, particular transaction-based application used by multiple customers), for a particular type of data (e.g., video data only with no audio, audio data only, mixed video and audio content, data output or read by particular scientific or analytical instrument, and the like). In a similar manner as described above with respect to the premium tiered HW device 410*b*, an embodiment may use information gathered for particular data sets of a customer to recommend to the customer the higher compression ratios achievable using a particular set of compression algorithms that may be implemented in the HW device 502 available for purchase.

An embodiment may include all 3 HW devices 410*a*, 410*b* and 502 as illustrated in the FIG. 8. As an alternative, an embodiment may generally include any 1 or more of the HW devices 410*a*, 410*b* and 502. For example, an embodiment may include the HW devices 410*a* and 502 where the HW device 502 may be an upgrade purchased by the customer of the data storage system.

In terms of product commercialization and pricing, the HW devices 410*b* and 502 may each be available for an additional cost. In at least one embodiment, the HW device 410*a* may be included in a configuration and may be required in order to purchase or utilize either of the HW devices 410*b* and 502 in a configuration. In at least one embodiment the different HW devices 410*a*, 410 and 502 may be included in a tiered pricing model. For example, from lowest cost to most expensive, the HW devices may be ranked as: the HW device 410*a*, HW device 410*b*, HW device 502.

With reference back to FIG. 5, described is an embodiment in which the host performs the sampling of the data to estimate the compression ratios achieved for different data sets using different compression algorithms. In other words, the host performs the processing to gather the compression ratio information 210 as illustrated in more detail in FIG. 6. Rather than have the host perform such processing, an embodiment may alternatively have the data storage system perform such processing to gather the compression ratio information 210 as illustrated in more detail in FIG. 6 which may then be further provided to the centralized collection site 220, used to make recommendations to customers regarding better compression ratios achieved using the premium tier, and the like. The host performing such processing offloads the processing from the data storage system. However, an embodiment may alternatively select to offload such processing from the host to the data storage system to gather the compression ratio information 210 as illustrated in more detail in FIG. 6.

In at least one embodiment in which the data storage system performs the sampling of different data sets to determine compression ratios for different compression algorithms, the compression algorithms may be implemented in software alone, in software in combination with one or more of the HW devices 410*a*, 410*b*, 502, or in HW alone such as implemented in HW of one or more of the HW devices 410*a*, 410*b*, 502, depending on what may be installed or available for use on the data storage system. Thus in connection with collecting or determining the information in the table 300 of compression ratio information or compression hints 212, when performed on the data storage system rather than the host, the compression algorithms may be implemented in software alone, in software in combination with one or more of the HW devices 410*a*, 410*b*, 502, or in HW alone such as implemented in HW of one or more of the HW devices 410*a*, 410*b*, 502, depending on what may be installed or available for use on the data storage system.

In at least one embodiment, the data storage system may perform processing to collect the information in the table 300 of compression ratio information or compression hints 212 using at least one of the HW devices 410*a*, 410*b*, 502 implementing at least one compression algorithm. However, in such an embodiment, whether any of the HW devices 410*a*, 410*b*, 502 may be enabled for use in connection with compressing user data stored on the data storage system may vary with what is licensed for use for particular data sets, hosts, and the like, on the data storage system. Licensing that may be used in connection with the techniques herein is described in more detail in following paragraphs.

The compression hints 212 provided to the data storage system 120 by the host 102 or otherwise determined by the data storage system 120 may also be used by the data storage system 120 in decision making performed by a compression engine for selecting a particular compression algorithm implemented by a particular HW device to use for each particular data set.

Figure 9:
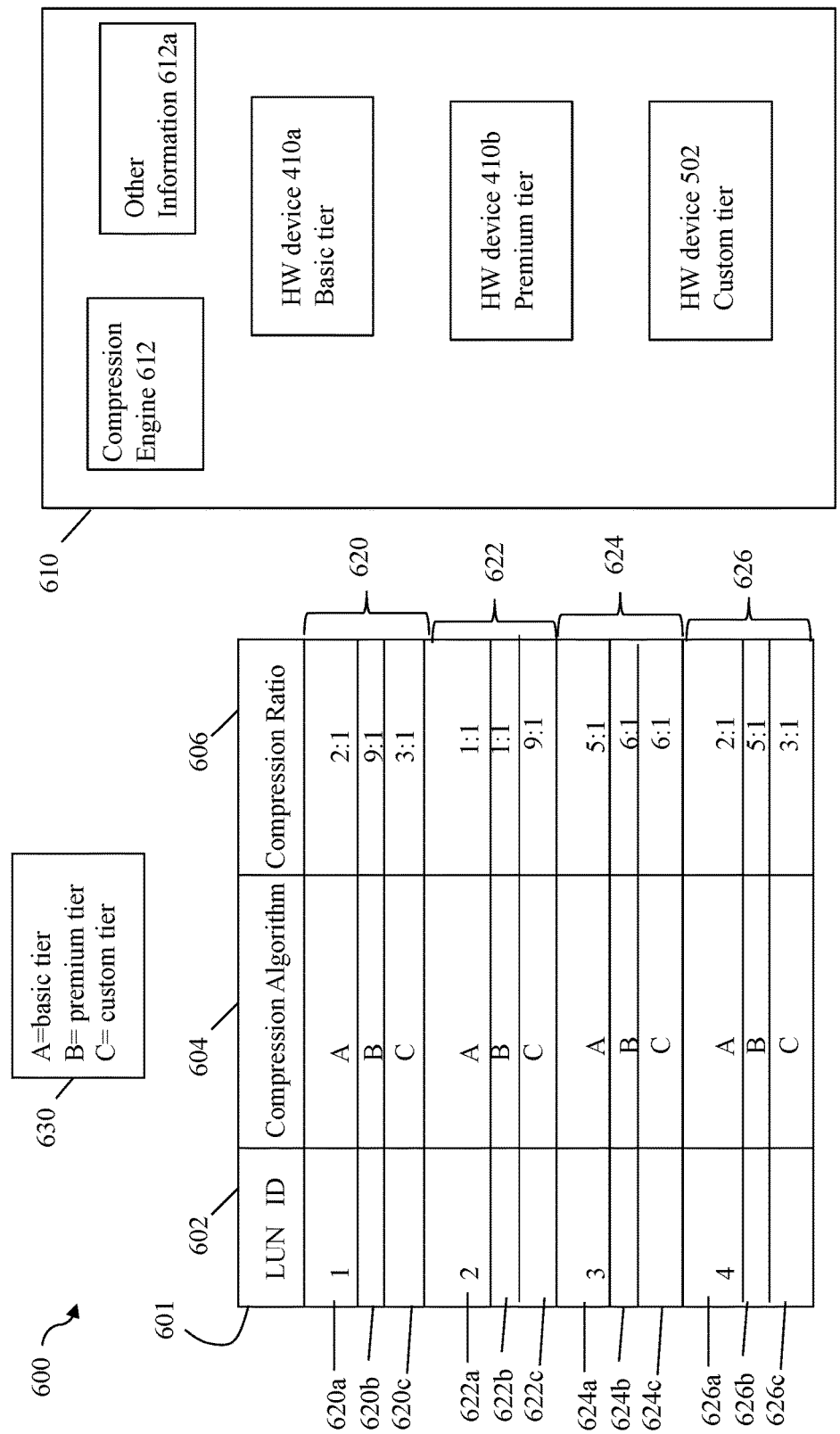

To further illustrate, reference is made to FIG. 9. The example 600 of FIG. 9 includes a table 602 including a portion of the compression hints 212 as may be provided by the host. The table 601 includes only a portion of the information of the table 300 of FIG. 6 for simplification of illustration.

Element 610 denotes a data storage system including components for use with the techniques herein. The data storage system 610 includes other components as described elsewhere herein but are omitted from FIG. 9 for simplification of illustration. The data storage system 610 includes a compression engine 612, and HW devices 410a, 410b and 502. In the embodiment of FIG. 9, all compression algorithms implemented by all 3 HW devices 410a, 410b, 502 may be available for use with the techniques herein for any data set, which in this example, is each LUN. The compression engine 612 may perform processing to determine whether a data portion written is compressed or not, and if compressed, select a particular compression algorithm for use in compressing the data portion. The compression engine 612 may use the information in the table 601 in connection with determining whether to compress data written to a particular LUN and, if so, selecting the particular compression algorithm and associated HW device used to compress the data written.

It should be noted that the compression engine 612 may also use other information 612a in connection with its processing to determine whether or not to compress data of a LUN and if compressed, selecting a particular compression algorithm. For example, the other information 612a may include other criteria or settings for a particular LUN or data set such as whether compression is enabled or not. If compression is disabled for the LUN or other data set, then compression is not performed for data written or stored on the LUN or other data set. As another example, in at least one embodiment, whether a data portion is compressed or not may include considering the activity or I/O accesses of the data portion. If the data portion's I/O activity (e.g., amount of data read and written per unit of time, I/Os per second, and the like) exceeds a specified threshold, then the data portion may not be compressed. The other information 612a may include a minimum threshold denoting a minimum expected compression ratio used in determining whether to compress data stored on a particular LUN. If no compression algorithm is expected to achieve at least the minimum threshold, then data stored on the LUN may not be compressed. The foregoing as well as other criteria may be used in making a decision about whether to compress a data portion written to a LUN or not.

The table 601 includes rows 620 including compression ratio information for LUN1; rows 622 including compression ratio information for LUN2; rows 624 including compression ratio information for LUN3; and rows 626 including compression ratio information for LUN4. Element 630 indicates that compression algorithm A is included in the basic tier implemented in HW by HW device 410a; compression algorithm B is included in the premium tier implemented in HW by HW device 410b; and compression algorithm C is included in the custom tier implemented in HW by HW device 502. For simplification, only a single compression algorithm is included in each of the basic, premium and custom tiers. However, more generally any number of compression algorithms may be included in each tier.

Consistent with other discussion herein compression may be performed inline as part of the I/O or data path such as when write pending data stored in cache is destaged from the cache and written out to the PDs (e.g., backend non-volatile storage devices of the data storage system). Compression may also be performed out of band or offline with respect to the I/O path. For example, a data set may be compressed during non-work hours or during periods of low or idle utilization of the data storage system when the data storage system may not be available for read and/or write access by a host or other client. For purposes of illustration, description below may be made with respect to performing compression inline but such techniques are more generally applicable for use at any suitable time.

For example, assume there is a defined minimum compression ratio threshold of 2:1. The compression engine 612 may receive first data written to LUN 1. Row 620a indicates an estimated compression ratio of 2:1 for sampled data written to LUN 1 using compression algorithm A. Row 620b indicates an estimated compression ratio of 9:1 for sampled data written to LUN 1 using compression algorithm B. Row 620c indicates an estimated compression ratio of 3:1 for sampled data written to LUN 1 using compression algorithm C. Based on the information in the rows 620, the compression engine 612 may determine that the first data is to be compressed using compression algorithm B (e.g., row 620b) since this compression algorithm is estimated to achieve the highest compression ratio, 9:1, of all compression algorithms A, B and C. The estimated compression ratio, 9:1, expected with compression algorithm B exceeds the minimum compression ratio threshold of 2:1 and the compression engine determines that the first data written to LUN 1 is compressed using compression algorithm B. Since compression algorithm B is in the premium tier, the compression engine 612 communicates with the HW device 410b to perform the desired compression using compression algorithm B.

As another example, assume there is a defined minimum compression ratio threshold of 2:1. The compression engine 612 may receive second data written to LUN 2. Row 622a indicates an estimated compression ratio of 1:1 for sampled data written to LUN 2 using compression algorithm A. Row 622b indicates an estimated compression ratio of 1:1 for sampled data written to LUN 2 using compression algorithm B. Row 622c indicates an estimated compression ratio of 9:1 for sampled data written to LUN 2 using compression algorithm C. Based on the information in the rows 622, the compression engine 612 may determine that the second data is to be compressed using compression algorithm C (e.g., row 622b) since this compression algorithm is estimated to achieve the highest compression ratio, 9:1, of all compression algorithms A, B and C. The estimated compression ratio, 9:1, expected with compression algorithm C exceeds the minimum compression ratio threshold of 2:1 and the compression engine determines that the second data written to LUN 2 is compressed using compression algorithm C. Since compression algorithm C is in the custom tier, the compression engine 612 communicates with the HW device 502 to perform the desired compression using compression algorithm C.

As another example, assume there is a defined minimum compression ratio threshold of 2:1. The compression engine 612 may receive third data written to LUN 3. Row 624a indicates an estimated compression ratio of 5:1 for sampled data written to LUN 3 using compression algorithm A. Row 624b indicates an estimated compression ratio of 6:1 for sampled data written to LUN 3 using compression algorithm B. Row 624*c* indicates an estimated compression ratio of 6:1 for sampled data written to LUN 3 using compression algorithm C. Based on the information in the rows 624, the compression engine 612 may determine that the third data is to be compressed using either compression algorithm B or C (e.g., rows 622*b-c*) since these compression algorithms are estimated to achieve the highest compression ratio, 6:1, of all compression algorithms A, B and C. The estimated compression ratio, 6:1, expected with compression algorithms B and C exceeds the minimum compression ratio threshold of 2:1 and the compression engine determines that the third data written to LUN 3 is compressed using either compression algorithms B or C.

In at least one embodiment, the compression engine may use other information in selecting whether to use compression algorithm B or C since both have an estimated compression ratio of 6:1 as denoted, respectively, by rows 624*b-c*. For example, an embodiment may select the algorithm expected to be the quickest. For example, referring back to FIG. 6, the total TBs sampled 308 divided by the total time 310 for the algorithms B and C may denote the estimated throughput of each algorithm. The compression engine may select the one of the compression algorithms B and C having the highest throughput. In this example, assume that algorithm B has a higher throughput that algorithm C so that algorithm B is selected for compression for the third data. Since compression algorithm B is in the premium tier, the compression engine 612 communicates with the HW device 410*b* to perform the desired compression using compression algorithm B.

As another example, assume there is a defined minimum compression ratio threshold of 2:1. The compression engine 612 may receive fourth data written to LUN 4. Row 626*a* indicates an estimated compression ratio of 2:1 for sampled data written to LUN 4 using compression algorithm A. Row 626*b* indicates an estimated compression ratio of 5:1 for sampled data written to LUN 4 using compression algorithm B. Row 626*c* indicates an estimated compression ratio of 3:1 for sampled data written to LUN 4 using compression algorithm C. Based on the information in the rows 626, the compression engine 612 may determine that the third data is to be compressed using either compression algorithm B since the compression algorithm B is estimated to achieve the highest compression ratio, 5:1, of all compression algorithms A, B and C. The estimated compression ratio, 5:1, expected with compression algorithm B exceeds the minimum compression ratio threshold of 2:1 and the compression engine determines that the fourth data written to LUN 4 is compressed using compression algorithm B. Since compression algorithm B is in the premium tier, the compression engine 612 communicates with the HW device 410*b* to perform the desired compression using compression algorithm B.

Referring to FIG. 10, shown is an example of licensing information that may be used in an embodiment in accordance with the techniques herein. The example 700 illustrates licensing information that may, more generally, be included in the other information 612*a* used by the compression engine 612 in its decision making. In particular, the licensing information 700 indicates different compression tiers that are licensed for each data set, such as per LUN. The table 700 includes a first column 702 of LUN IDs and a second column 704 of licenses. Each row of the table indicates what compression tiers (column 704) are licensed for use with a particular LUN ID (column 702). For example, row 710*a* indicates that the basic, premium and custom tiers are available for use with LUN 1; row 710*b* indicates that only the basic custom tier is available for use with LUN 2; the row 710*c* indicates that only the basic tier is available for use with LUN 3; and the row 710*d* indicates that the basic and premium tiers are available for use with LUN 4.

Generally, the licensing information in the table 700 of FIG. 10 indicates particular tiers which are licensed for use by different data sets, such as per LUN, where each particular tier of compression algorithms may be implemented in HW by a particular HW device. Thus, the licensing information of FIG. 10 denotes licensing that may be used to control and restrict the compression algorithms and tiers available for different data sets as well as control and restrict which of the HW devices 410*a*, 410*b* 502 may be used for HW-based compression of the different tiers.

In at least one embodiment of the data storage system 610 of FIG. 9, the licensing information 700 may be included in the other information 612*a* used, in combination with the compression hints 601, by the compression engine 612 to determine whether or not to compress data for a particular LUN, and if so, in selecting a particular compression algorithm.

To further illustrate, consider the example above for LUN 1 described in connection with FIG. 9. Such processing described above selected the compression algorithm B for storing the first data on LUN 1. In an embodiment using the licensing information of FIG. 10, row 710*a* is also used as additional criteria in determining whether to compress the first data or not and also in selecting a compression algorithm. In this case, row 710*a* indicates that all 3 tiers of compression algorithms are licensed for use with LUN 1. Thus, compression algorithm B may be used to compress the first data written to LUN1 where compression algorithm B achieves the best estimated compression ratio of all licensed compression algorithms A, B and for use with LUN 1. In this case, the compression engine 612 may communicate with HW device 410*b* to perform the desired compression.

Consider the example above for LUN 2 described in connection with FIG. 9. Such processing described above selected the compression algorithm C for storing the second data on LUN 2. In an embodiment using the licensing information of FIG. 10, row 710*b* is also used as additional criteria in determining whether to compress the second data or not and also in selecting a compression algorithm. In this case, row 710*b* indicates that only the basic tier of compression algorithms are licensed for use with LUN 2. Thus, only compression algorithm A may be used to compress the second data written to LUN2. In this case, the estimated compression ratio as denoted by row 622*a* is only 1:1 which is below the specified minimum threshold of 2:1. In this case with the added criteria of license information 710*b*, the compression engine determines that no compression is performed for the second data written to LUN 2.

Consider the example above for LUN 3 described in connection with FIG. 9. Such processing described above indicated generally that either compression algorithm B or C may be used for storing the third data on LUN 3. In an embodiment using the licensing information of FIG. 10, row 710*c* is also used as additional criteria in determining whether to compress the third data or not and also in selecting a compression algorithm. In this case, row 710*c* indicates that only the basic tier of compression algorithms are licensed for use with LUN 3. Thus, only compression algorithm A may be used to compress the third data written to LUN3. In this case, the estimated compression ratio as denoted by row 624*a* is 5:1 which exceeds the specified minimum threshold of 2:1. In this case with the added criteria of license information 710c, the compression engine determines that compression algorithm A may be used to compress the third data written to LUN 3. In this case, the compression engine 612 may communicate with HW device 410a to perform the desired compression.

Consider the example above for LUN 4 described in connection with FIG. 9. Such processing described above indicated generally that compression algorithm B may be used for storing the fourth data on LUN 4. In an embodiment using the licensing information of FIG. 10, row 710d is also used as additional criteria in determining whether to compress the fourth data or not and also in selecting a compression algorithm. In this case, row 710d indicates that the basic and premium tiers of compression algorithms are licensed for use with LUN 4. Thus, compression algorithms A or B may be used to compress the fourth data written to LUN4. In this case, the estimated compression ratio as denoted by row 626b is 5:1 which exceeds the specified minimum threshold of 2:1. In this case with the added criteria of license information 710d, the compression engine determines that compression algorithm B may be used to compress the fourth data written to LUN 4. In this case, the compression engine 612 may communicate with HW device 410b to perform the desired compression.

Generally, a license may be associated with any suitable entity and level of granularity. For example, a license for one or more tiers of compression algorithms used with the techniques herein may be for one or more hosts, one or more application instances executing on one or more hosts, or one or more data sets (e.g., data-set based criteria). A license may, of course, grant use rights in connection with combination of the foregoing as well. Generally, a license in accordance with techniques herein may grant use rights in connection with any combination of the various time-based and/or data set-based criteria described herein.

Additionally, a license used with the techniques herein may also grant rights to use various tiers of compression algorithms described herein for any suitable time period or recurring time periods (e.g., time-based criteria). For example, a license may be granted to use one or more of the tiers of compression algorithms for a continuum of time through an end specified expiration date (e.g., one or more tiers used by any data set through Dec. 31, 2019). A license may be granted for use during defined time periods through an end specified expiration date (e.g., daily during non-work hours from 6 p.m. through 7 a.m.). To further illustrate, a data storage system may store multiple data set for multiple customers and thus multiple hosts and applications (e.g., multi-tenant environment on a data storage system such as in a cloud-based environment). A backup application may execute on the data storage system to provide backup services the customers. It may be that only some of the customers pay for compression whereby compression is only enabled for the specified hosts, applications and/or data sets of those customers that pay for the compression services. Further, the backup services executing on the data storage system may only run at particular times of the day such as during non-working hours when the data storage system typically has a lower I/O workload with respect to external I/Os received from hosts, or more generally, data storage clients. The license on the data storage system may indicate that one or more of the tiers of compression algorithms implemented in HW are available for use daily but only during non-work hours from 6 p.m. through 7 a.m. The license may further indicate that the one or more tiers of compression algorithms are only licensed for use for particular data sets of those customers who have paid for compression services.

In at least one embodiment, a data storage system may ship with compression algorithms implemented in both the HW devices 410a, 410b, 502 and also software (e.g., such as using libraries of code that execute on processors of the data storage system rather than other HW devices 410a, 410b, 502 to perform compression). However, in such an embodiment, whether any of the HW devices 410a, 410b, 502 may be enabled for use in connection with compressing user data stored on the data storage system may vary with what is licensed for use on the data storage system. In such an embodiment, the software version of a small number of compression algorithms may be used by default for compression when there is no license grant for compression processing using any of the HW devices 410a, 410b, 502. In this latter case, a user of the data storage system having only software-based compression services enabled may be presented with information regarding the possible further data reduction gains as well as I/O and data storage system performance improvements if the user purchases one or more additional licenses for HW-based compression using one or more of the HW devices 410a, 410b, 410c.

In at least one embodiment in accordance with the techniques herein, the other information 612a and criteria used to determine whether to perform compression or not, and if so, select a compression algorithm may also include one or more criteria related to the workload of the data storage system or I/O workload. For example, one or more metrics may be used to measure a current workload of the data storage system. Such one or more metrics may include one or more of: CPU or component utilization with respect to the data storage system (e.g., utilization of FAs, DAs, processors of the data storage system); I/O rate (e.g., I/Os per second) regarding I/Os received by the data storage system; data throughput (e.g., amount of data per unit of time such as MB s/second) processed by the data storage system in connection with servicing reads and writes directed to data stored on the data storage system; amount of written pending data in the cache waiting to be destaged to the backend PDs; amount of available cache; amount of cache consumed for storing WP data; number of I/Os that have been received at the data storage system and are waiting in a queue to be processed (e.g., current queue depth of one or more FAs, and/or current queue depth of one or more DAs), number of I/Os waiting in the queue to be sent to one of the HW devices 410a, 410b, 502; and the like. One or more thresholds may specified for any of the foregoing that may be used in an embodiment denoting a maximum acceptable level of busyness or workload. If the current value for a metric indicates a higher workload or level of busyness exceeding that of the threshold, then the compression engine may currently not perform compression inline as part of the I/O path for data stored on the data storage system, or may use such information in connection with selecting one of multiple possible compression algorithms to be used to compress data.

For example, generally, compression algorithms may be ranked in terms of expected computation times to perform compression of a specified amount of data. In at least one embodiment, compression algorithms that are expected to have higher compression ratios are expected to also have higher computation times and thus require more processor time to compress the same data than other compression algorithms achieving lower compression ratios. In this manner, an embodiment in accordance with the techniques herein may rank available compression algorithms in terms of computation time requirements or intensity. For example, with reference to FIG. 11, the compression algorithms may be ranked, from highest expected computation time to lowest expected computation time. The example 800 of FIG. 11 includes a table of compression algorithms 802 ranked from highest expected computation time to lowest expected computation time. In particular, table 802 indicates that: compression algorithm C included in the custom tier as described above in connection with FIG. 9 is expected to have the highest compression ratio of all 3 compression algorithms A, B and C; compression algorithm B included in the premium tier as described above in connection with FIG. 9 is expected to have the second highest compression ratio of all 3 compression algorithms A, B and C; and compression algorithm A included in the custom tier as described above in connection with FIG. 9 is expected to have the lowest compression ratio of all 3 compression algorithms A, B and C. The algorithm ranked highest in expected compression ratio (e.g., C) may also have highest expected computation time of all ranked algorithms. The algorithm ranked lowest in expected compression ratio may also have lowest expected computation time of all ranked algorithms.

In at least one embodiment, if the workload of the data storage system or I/O workload based on one or more metrics exceeds a specified maximum workload level, then the compression engine may currently disable compression for inline data written as part of the I/O or data path. Compression of such data may be performed at a later time when the system has a lower workload level. Alternatively, the data storage system may perform compression and may select a compression algorithm that has a minimum computation time. For example, assume that any of compression algorithms A, B and C implemented in HW by the HW devices 410a, 410b, 502 are available for use when compressing write data directed to a LUN. If the data storage system has a measured workload level exceeding a specified threshold, the compression engine may perform compression using compression algorithm A for the write data rather than algorithms B or C.

As another option, multiple workload thresholds may be specified. For example, a first workload threshold and a second workload threshold may be specified where the first threshold denotes a higher workload level than the second workload threshold. If the current workload exceeds the first threshold, the compression engine may temporarily disable compression performed as part of the I/O path. If the current workload does not exceed the first threshold but exceeds the second threshold, the compression engine may select one of the algorithms having one of the lower/lowest ranked computation times, or selecting one that is not ranked higher than a specified position in the ranking, or selecting one that does not have an expected computation time higher than a particular threshold. For example, with reference to the FIG. 11, assume as above that any of compression algorithms A, B and C implemented in HW by the HW devices 410a, 410b, 502 are available for use when compressing write data directed to a LUN. Assume further the measured workload exceeds the second threshold but not the first threshold. In this case, the compression engine may select algorithm A for compressing the write data of the LUN. As a variation, criteria may be specified indicating that if the measured workload is between the first and second thresholds, any available compression algorithm may be selected other than the highest ranked algorithm A (highest ranked in terms of computation time or compression ratio). In this case the compression engine may select compression algorithm B implemented by HW device 410b.

Figure 11:
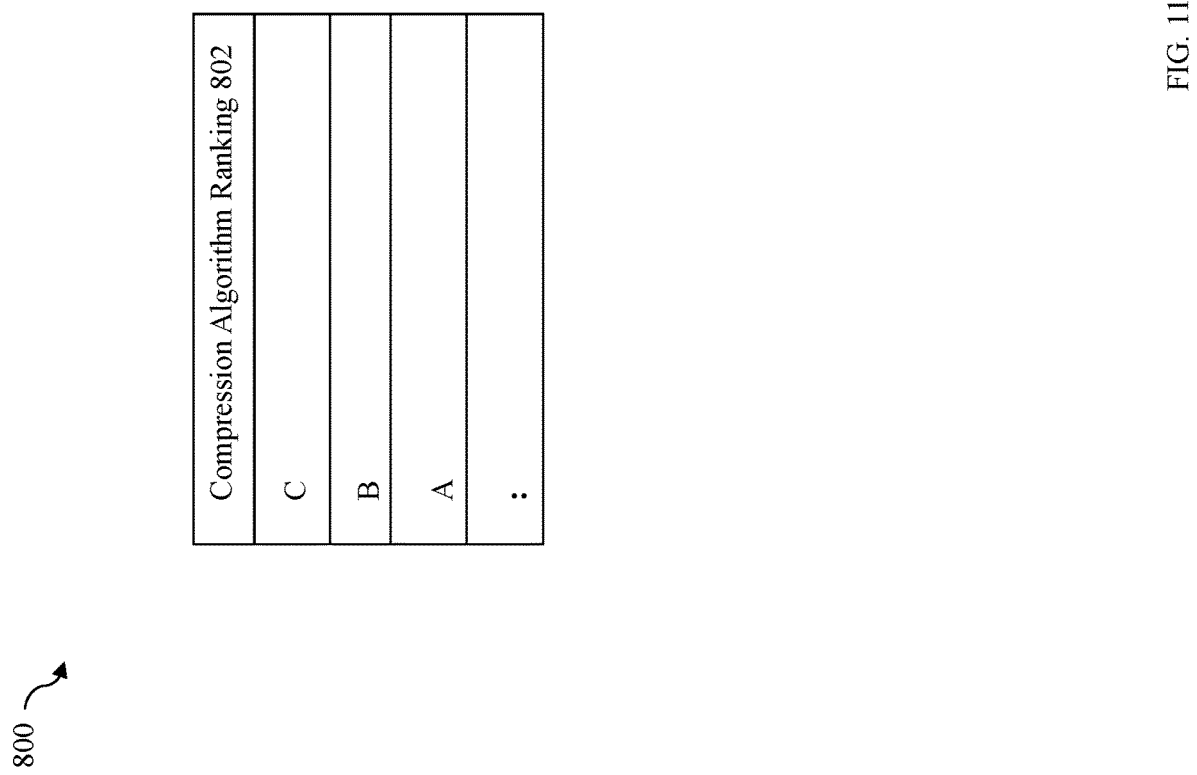
FIG. 11 is an example illustrating a compression algorithm ranking that may be used in an embodiment in accordance with the techniques herein.

The foregoing ranking of FIG. 11 may be determined using any suitable technique. For example, the ranking may be based on compression ratios, computation times and amount of data sampled such as included in the collected information of table 300 of FIG. 6. The ranking may be predetermined and included in a file or configuration information of the data storage system.

Figure 12:
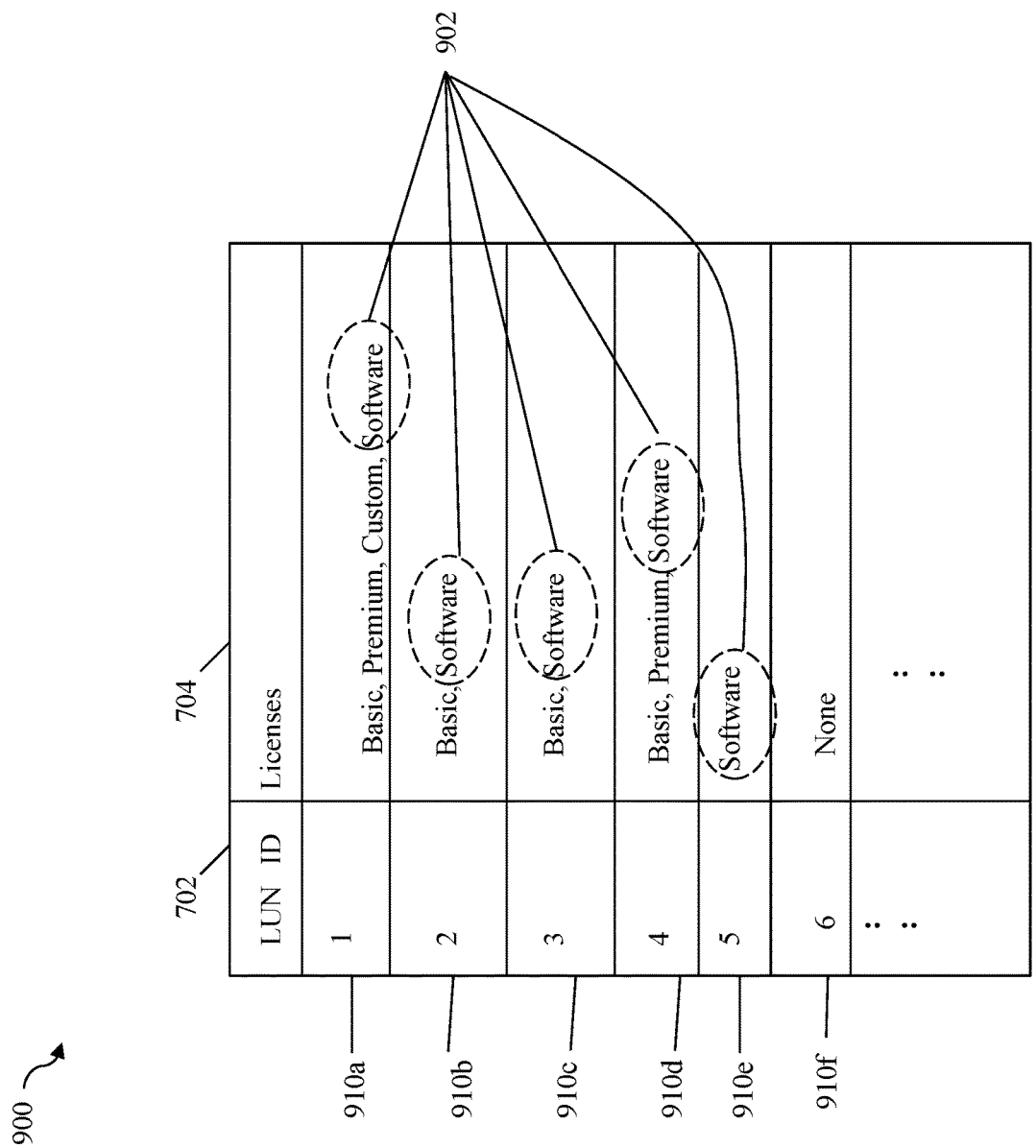

Referring to FIG. 12, shown is another example illustrating license information of the data storage system that may be used in an embodiment in accordance with the techniques herein. The example 900 is similar to the licensing information of FIG. 10 with the added difference that the licensing information in FIG. 12 may also indicate whether the software version of the compression algorithms are licensed for use by particular data sets. For example, element 902 indicates that data of LUNs 1, 2, 3, 4 and 5 (e.g., respectively in rows 910a-e) are licensed to use the software implementation of the compression algorithms. In such an embodiment, it may be possible that particular data sets have no compression license for HW or software-based compression. For example, row 910f indicates that data stored on LUN 6 is not licensed for any compression. Thus, data written to and stored on LUN 6 is not compressed based on the licensing information of 910f.

In at least one embodiment, additional processing regarding selection of a compression algorithm for use with a particular I/O may be shifted to the host. As discussed above such as in connection with FIG. 5, the host may provide the data storage system with the compression hints 212, such as in the form of the table of FIG. 6. The data storage system may then use with collected information to determine whether to perform compression for a particular data set and additionally in selecting one from possibly many compression algorithms to use for compressing data of a data set. As a variation, described below is an embodiment in which the host selects a compression algorithm for use with a particular I/O and then tags the I/O with a flag or other indicator denoting the particular compression algorithm selected for the data written by the particular I/O.

Figure 13:
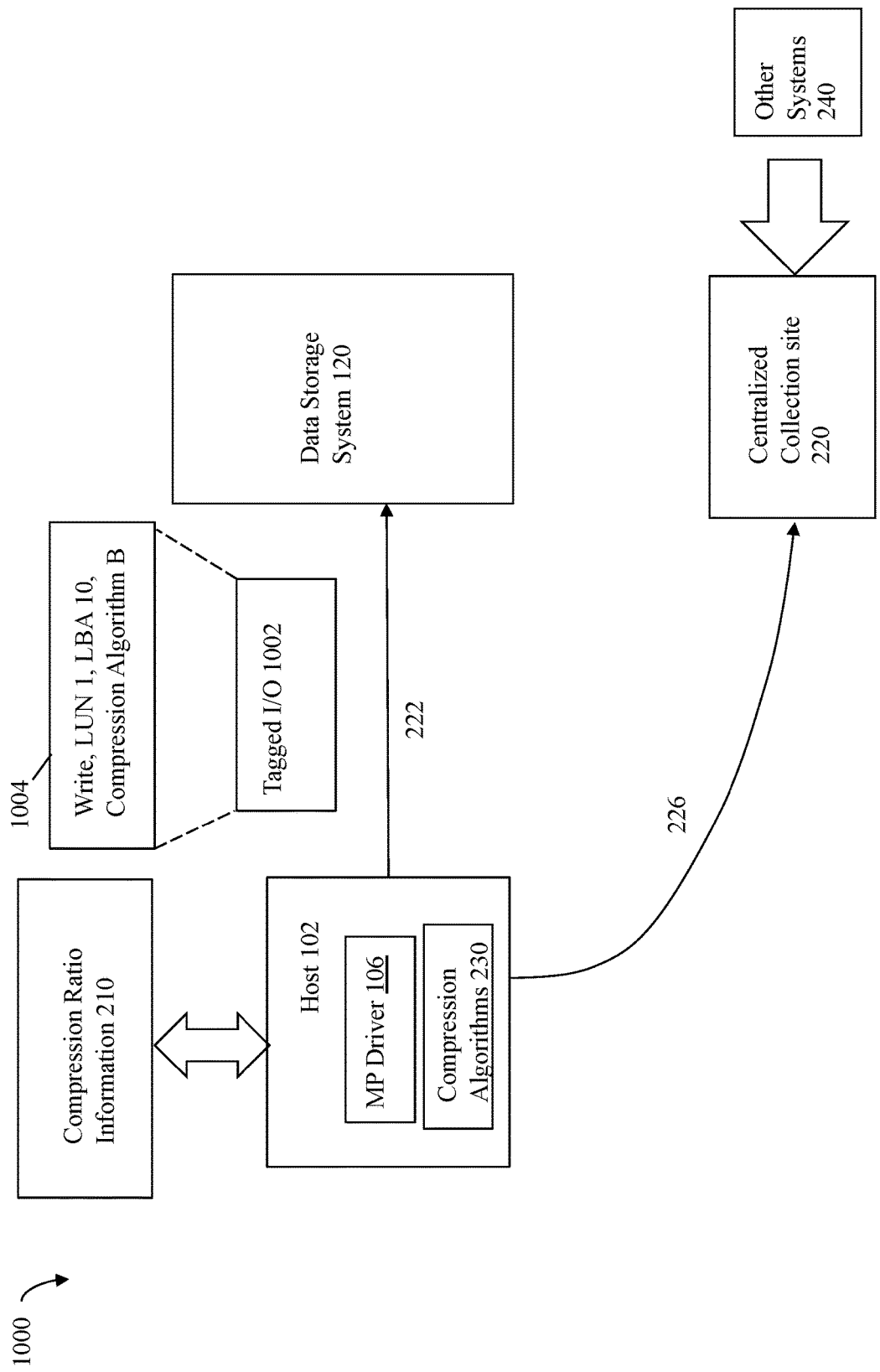

To further illustrate, reference is made to the FIG. 13. Components of the example 1000 of FIG. 13 are similarly numbered to those as illustrated in FIG. 5. Additionally in the example 1000, a tagged I/O 1002 is transmitted from the host 102 to the data storage system 120 rather than, as in FIG. 5, the compression ratio information 210 in the form of compression hints 212. In the embodiment of FIG. 13, the MP driver 106 of the host 102 may perform processing and use the compression ratio information 210 to select, per write I/O, the compression algorithm expected to achieve the best compression for the data written by the write I/O. The host 102 may collect compression ratio information as described above (e.g., in connection with FIG. 6, table 601 of FIG. 9). Using this information, the host may select, per write I/O, which of the compression algorithms is currently expected to achieve the highest compression ratio based on the data sampled. For example, assume the MP driver 106 receives an write I/O from an application executing on the host 102 and the MP driver 106 performs processing to issue the write I/O to the data storage system 120. Assume in this example, the MP driver 106 has the information of table 601 collected for its use. As denoted by 1004, the write I/O may be directed to LUN 1, LBA 10. Based on the information in the table 601 as collected on the host 102, the MP driver 106 may examine rows 620 and determine that compression algorithm B (in row 620b) is expected to result in the highest compression ratio of 9:1 for data written to LUN 1. In this case, the host 102 may send the tagged I/O 1002 over connection 222 from the host 102 to the data storage system 120. Element 1004 is a representation of information that may be included in the tagged write I/O 1002 issued from the host 102 to the data storage system 120. As denoted by 1004, the tagged I/O 1002 may include information indicating the I/O operation is a write to LUN 1, LBA 10 and that compression algorithm B is selected by the host 102. The data storage system 120 may receive the tagged I/O 1002 and use the tag denoting the host selected compression algorithm B in connection with determining which compression algorithm, if any, may be used to compress the write I/O data for the tagged I/O 1002.

In at least one embodiment, the host 102 and the data storage system 120 may have a predefined or negotiated set of compression algorithms from which the host will sample data to determine compression ratios and make recommendations with tagged I/Os regarding a selected one of the compression algorithms to use for compressing data of a particular I/O. For example, in at least one embodiment, a number of bits may denote an enumeration of the predefined or negotiated set of compression algorithms. A field in the I/O operation 1002 may have a numeric value denoting the particular one of the compression algorithms selected. For example, assume that there are 3 compression algorithms, A, B and C. Two (2) bits in a tag or tag field the write I/O 1002 may be used to denote a value of the particular one of the 3 compression algorithms selected by the host 1002. For example, a value of 0 in the tag field indicates compression algorithm A; a value of 1 in the field indicates compression algorithm B; and a value of 2 in the field indicates compression algorithm C. Of course, the size of the field varies with the number of possible compression algorithms. The data storage system, in particular the compression engine of the data storage system, may use the compression hint as conveyed in the tag of the I/O operation 1002 in connection with determining whether to compress the write I/O data, and if so, what particular algorithm to use for compressing the write I/O data.

In at least one embodiment, the host 102 may select the compression algorithm achieving the best estimated compression ratio for a write I/O directed to a particular data set, such as a LUN. As a variation, the tag of the I/O 1002 may further identify a selected one of the compression algorithms, as noted above, or additionally no compression. In this case, the tag field has 1 of 4 possible values, rather than 3 possible values, as noted above. For example, the a value of 0 in the tag field indicates compression algorithm A; a value of 1 in the field indicates compression algorithm B; a value of 2 in the field indicates compression algorithm C; and a value of 3 in the tag field may indicate no compression. To indicate no compression, the host 102 may have a specified minimum threshold compression ratio, such as 2:1. If the estimated compression ratio is not at least the threshold compression ratio, then the tag of the I/O would indicate no compression. For example, assume there is a write to a LUN where the measured compression ratio is 1:1 all the compression algorithms A, B and C, in this case, the tag of the write has a value of 4 indicating no compression.

The data storage system 120 may also generally use any of the other techniques as described herein in combination with the tagged I/Os as described in connection with the FIG. 13. For example, the licensing information of the data storage system as described in connection with FIGS. 9, 10 and 12 may be used with tagged I/Os. In such an embodiment, if the particular compression algorithm identified by the tag of a write I/O directed to a particular LUN is not licensed for use with the LUN, then the data storage system may determine not to compress the write I/O data. The data storage system may determine whether or not to compress the write I/O data in connection with possibly other information and criteria as described herein.

It should be noted that the compression hints in connection with various embodiments described herein may be sent from the host to the data storage system in any suitable manner. For example, in at least one embodiment, a vendor unique SCSI command may be used to send the compression hints from the MP driver of the host to the data storage system.

Generally, the compression hints may be sent from the MP driver of the host to any selected target port of any selected FA director. In at least one embodiment, the compression hints in the form of a vendor unique SCSI command may be sent to a particular FA director determined as the least busy FA director of the data storage system. In at least one embodiment, the MP driver may be tracking the relative level of busyness, or more generally, relative workload or utilization of the different FA directors of the data storage system. For example, the MP driver may also perform such tracking as part of workload balancing in connection with selecting which FA to direct host I/Os. The particular FA director selected may have additional processor time and resource to perform the requested preprocessing. The workload of the FAs of the data storage system may be determined using any suitable technique. In one embodiment, the MP driver may determine the relative workload or utilization of the different FAs by monitoring the queue depth of the queued pending, outstanding or in-progress I/Os already sent to particular target DS ports of the FAs. Queue depth may be defined as the number of entries or queued I/Os on the host where the I/O are directed to one of the target ports or FAs of the data storage system. Thus the queue depth denotes the number of I/Os for which the host is waiting for a response from a particular target port or FA. The longer the queue for a particular target port or FA, the busier or higher the workload of that target port or FA. In this manner, the compression hints may be sent to the target port or FA having the shortest queue of pending, outstanding or in-progress I/Os.

What will now be described are flowcharts of processing steps that may be performed in an embodiment in accordance with the techniques herein. The flowcharts summarize processing described above.

Figure 14:
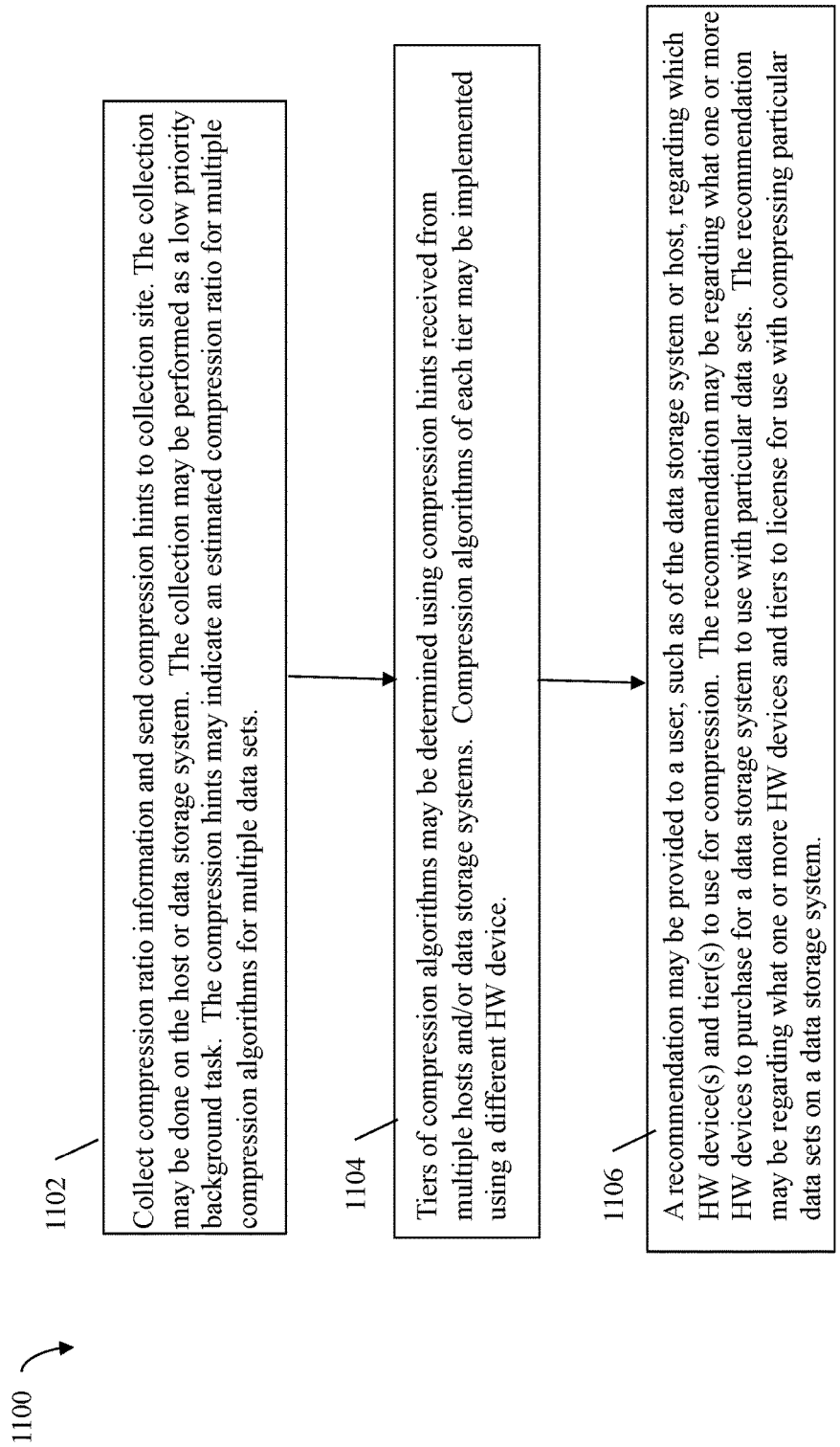
FIGS. 14, 15 and 16 are flowcharts of processing steps that may be performed in an embodiment in accordance with the techniques herein.

Referring to FIG. 14, shown is a first flowchart 1100 of processing steps that may be performed in an embodiment in accordance with the techniques herein. At the step 1102, compression ratio information may be collected and sent to a collection site The collection of the compression ratio information may be performed by the host or data storage system. The collection may be performed as a low priority background task. The compression ratio information may indicate an estimated compression ratio for multiple compression algorithms for multiple data sets.

In connection with the step 1102, if the compression ratio information is collected by the host, it may be sent in the form of compression hints from the host to the data storage system, and then from the data storage system to the collection site. Alternatively, the collected information may be sent directly from the host to the collection site.

In connection with the step 1102, if the compression ratio information is collected by the data storage system, the data storage system may send the collected information to the collection site.

From the step 1102, processing continues with the step 1104. At the step 1104, tiers of compression algorithms may be determined using the compression hints received from multiple hosts and/or data storage systems. Compression algorithms of each tier may be implemented using a different HW device.

From the step 1104, processing proceeds to the step 1106. At the step 1106, processing may be performed to provide a recommendation to a user, such as of the data storage system or host, regarding which HW device(s) and tier(s) to use for compression. The recommendation may be regarding what one or more HW devices to purchase for a data storage system to use with particular data sets. The recommendation may be regarding what one or more HW devices and tiers to license for use with compressing particular data sets on a data storage system.

Figure 15:
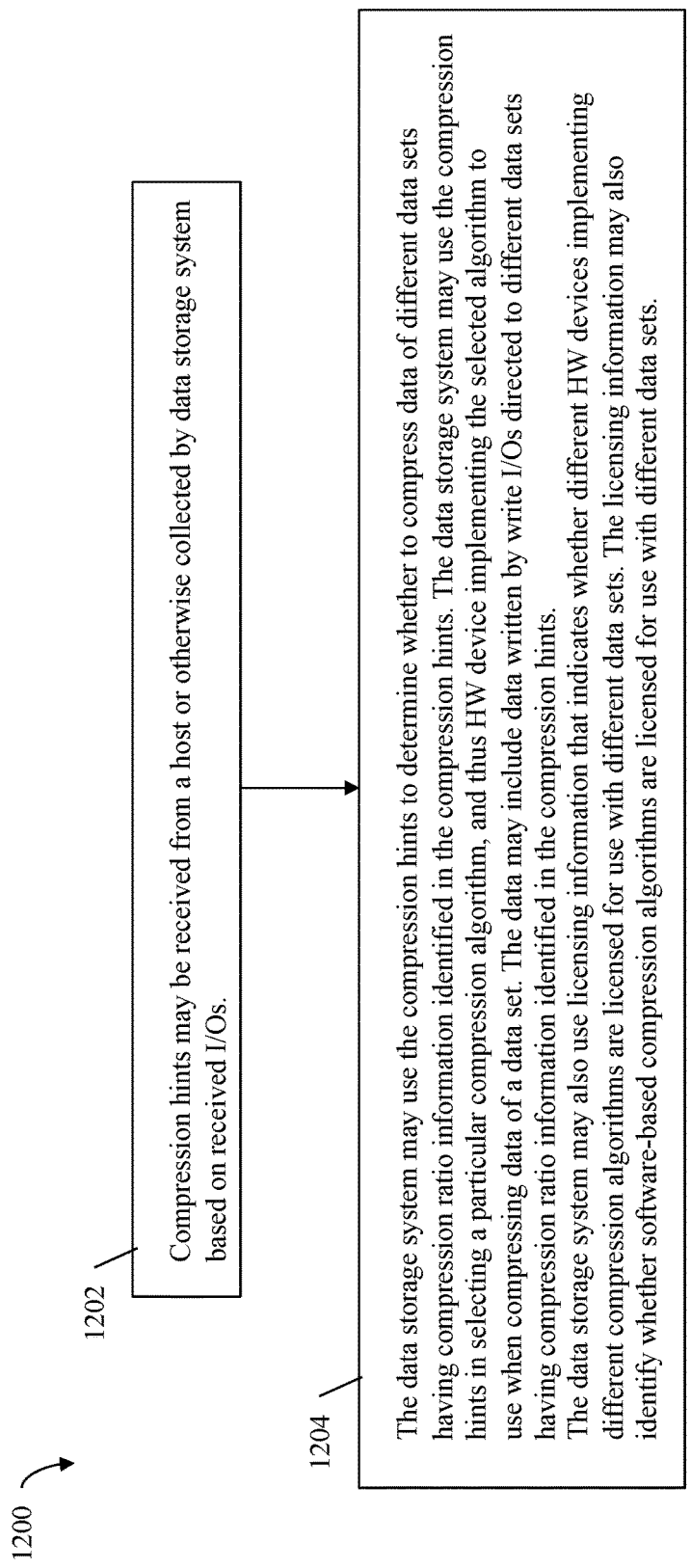

Referring to FIG. 15, shown is a second flowchart 1200 of processing steps that may be performed in an embodiment in accordance with the techniques herein. The flowchart 1200 generally outlines processing that may be performed by a data storage system in using the compression hints in connection with compression processing.

At the step 1202, compression hints may be received on the data storage system from a host or otherwise collected by the data storage system based on received I/Os from the host. From the step 1202, control proceeds to the step 1204.

At the step 1204, The data storage system may use the compression hints to determine whether to compress data of different data sets having compression ratio information identified in the compression hints. The data storage system may use the compression hints in selecting a particular compression algorithm, and thus HW device implementing the selected algorithm, to use when compressing data of a data set. The data may include data written by write I/Os directed to different data sets having compression ratio information identified in the compression hints. The data storage system may also use licensing information that indicates whether different HW devices implementing different compression algorithms are licensed for use with different data sets. The licensing information may also identify whether software-based compression algorithms are licensed for use with different data sets.

Figure 16:
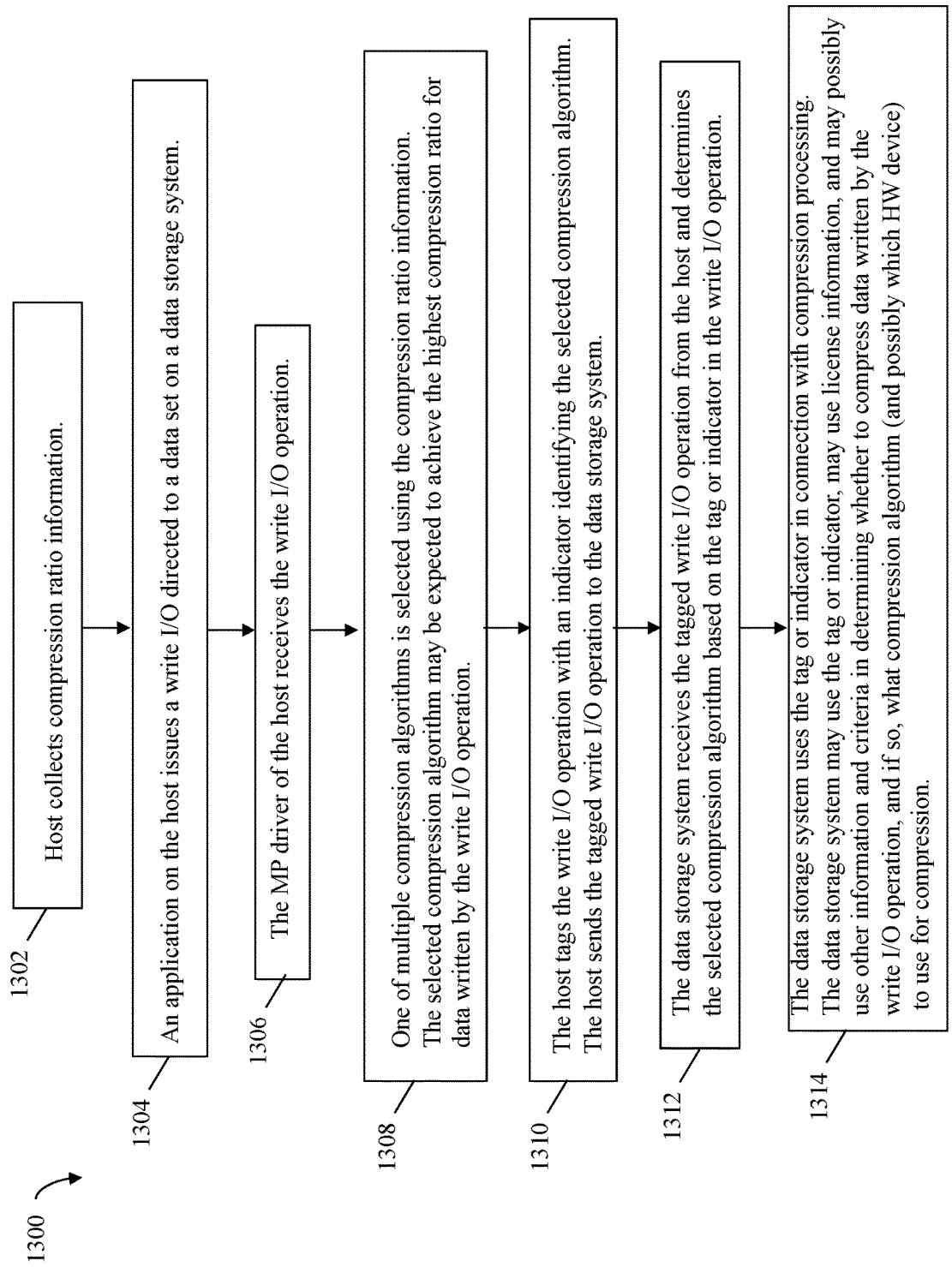

Referring to FIG. 16, shown is a third flowchart 1300 of processing steps that may be performed in an embodiment in accordance with the techniques herein. The flowchart 1300 outlines processing that may be performed in connection with generating and using tagged write I/Os.

At the step 1302, the host collects compression ratio information. From the step 1302, control proceeds to the step 1304. At the step 1304, an application om the host issues a write I/O directed to a data set on a data storage system. From the step 1304, control proceeds to the step 1306 where the MP driver of the host receives the write I/O operation. From the step 1306, control proceeds to the step 1308. At the step 1308, one of multiple compression algorithms is selected using the compression ratio information. The selected compression algorithm may be expected to achieve the highest compression ratio for the data written by the write operation.

From the step 1308, control proceeds to step 1310. At the step 1310, the host tags the written I/O operation with an indicator or tag identifying the selected compression algorithm. The host sends the tagged write I/O operation to the data storage system. From the step 1310, control proceeds to the step 1312. At the step 1312, the data storage system receives the tagged write I/O operation from the host and determines the selected compression algorithm based on the tag or indicator in the write operation received. From the step 1312, control proceeds to the step 1314. At the step 1314, the data storage system uses the tag or indicator in connection with compression processing. The data storage system may use the tag or indicator denoting the selected compression algorithm, may use license information, and may possibly use other information and criteria in determining whether to compress data written by the write I/O operation and if so, which compression algorithm to use. If the compression algorithm to be used to compress the data is implemented by one of the HW devices available on the system, then such processing of step 1314 also includes selecting the particular HW device used for compression.

The techniques herein may be performed using any suitable hardware and/or software. For example, the techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method of determining and using a plurality of tiers of compression algorithms comprising:
receiving a plurality of sets of compression information for a plurality of compression algorithms used to compress a plurality of data sets, wherein each of the plurality of sets of compression information is collected for I/O operations issued to a different one of a plurality of data storage systems;
determining, using the plurality of sets of compression information, a first of the plurality of tiers of compression algorithms, wherein each compression algorithm of the plurality of compression algorithms in the first tier achieves first estimated compression ratio criteria for at least a first portion of the plurality of data sets, wherein compression algorithms in the first tier are implemented using a first hardware (HW) device, wherein the first estimated compression ratio criteria for the first tier indicates that each compression algorithm of the first tier, for at least a first minimum percentage of data compressed using said each compression algorithm, achieves a specified compression ratio within a first specified compression ratio range;
determining, using the plurality of sets of compression information, a second of the plurality of tiers of compression algorithms, wherein each compression algorithm of the plurality of compression algorithms in the second tier achieves second estimated compression ratio criteria for at least a second portion of the plurality of data sets, wherein each compression algorithm in the second tier is expected to achieve a higher rate of compression than compression algorithms in the first tier, wherein compression algorithms in the second tier are implemented using a second HW device, wherein the second estimated compression ratio criteria for the second tier indicates that each compression algorithm of the second tier, for at least a second minimum percentage of data compressed using said each compression algorithm, achieves a specified compression ratio within a second specified compression ratio range which is different than the first specified compression ratio range;

providing a recommendation, in accordance with one of the plurality of sets of compression information regarding a plurality of I/O operations issued to a first of the plurality of data storage systems, regarding whether to use the first HW device or the second HW device in connection with compression on the first data storage system;

receiving workload criteria including a first threshold and a second threshold, wherein the first threshold denotes a higher workload level than the second threshold;

responsive to determining that a current workload of the first data storage system exceeds the first threshold, disabling inline compression for a first content written by first write I/O operations included in the plurality of I/O operations; and responsive to determining that the current workload of the first data storage system exceeds the second threshold but does not exceed the first threshold, compressing the first content using a first compression algorithm, wherein the first compression algorithm has an expected computation time that does not exceed a specified threshold computation time, wherein said first compression algorithm is implemented using a recommended one of the first HW device or the second HW device identified in said recommendation.

2. The method of claim 1, further comprising:

determining, in accordance with the workload criteria of said first data storage system, to perform said inline compression of the first content written by the first write I/O operations included in the plurality of I/O operations received at said first data storage system, wherein said inline compression compresses said first content as part of an I/O path of said first write I/O operations; and selecting, in accordance with said workload criteria of said first data storage system, a particular compression algorithm to use to compress the first content, wherein the particular compression algorithm is implemented using a recommended one of the first HW device or the second HW device specified in said recommendation.

3. The method of claim 2, wherein the workload criteria includes one or more metrics that measure the current workload of said first data storage system.

4. The method of claim 3, wherein the one or more metrics include at least one of: CPU utilization in said first data storage system; component utilization of one or more types of components in said first data storage system; I/O rate regarding I/Os received by said first data storage system; data throughput denoting a data processing rate in connection with servicing reads and writes directed to data stored on said first data storage system; an amount of pending write data in a cache of said first data storage system wherein the pending write data is waiting to be destaged to backend non-volatile storage devices of said first data storage system; an amount of available cache in said first data storage system; an amount of cache consumed for storing the pending write data on said first data storage system; a number of I/O operations that have been received at said first data storage system and are waiting in one of a plurality of queues to be processed, a current queue depth of one or more front end directors of said first data storage system; a current queue depth of one or more backend directors of said first data storage system; and a number of I/Os waiting in a queue to be sent to one of a plurality of HW devices for compression.

5. The method of claim 4, wherein the component utilization includes utilization of front end directors in said first data storage system, wherein said front end directors receive I/O operations from external data storage system clients.

6. The method of claim 4, wherein the component utilization includes utilization of backend directors in said first data storage system, wherein said backend directors read data from, and write data to, backend non-volatile storage devices of said first data storage system.

7. The method of claim 1, wherein the plurality of sets of compression information are collected by a plurality of hosts.

8. A system comprising:

one or more processors; and one or more memories comprising code stored thereon that, when executed, performs a method of determining and using a plurality of tiers of compression algorithms comprising:

receiving a plurality of sets of compression information for a plurality of compression algorithms used to compress a plurality of data sets, wherein each of the plurality of sets of compression information is collected for I/O operations issued to a different one of a plurality of data storage systems;

determining, using the plurality of sets of compression information, a first of the plurality of tiers of compression algorithms, wherein each compression algorithm of the plurality of compression algorithms in the first tier achieves first estimated compression ratio criteria for at least a first portion of the plurality of data sets, wherein compression algorithms in the first tier are implemented using a first hardware (HW) device, wherein the first estimated compression ratio criteria for the first tier indicates that each compression algorithm of the first tier, for at least a first minimum percentage of data compressed using said each compression algorithm, achieves a specified compression ratio within a first specified compression ratio range;

determining, using the plurality of sets of compression information, a second of the plurality of tiers of compression algorithms, wherein each compression algorithm of the plurality of compression algorithms in the second tier achieves second estimated compression ratio criteria for at least a second portion of the plurality of data sets, wherein each compression algorithm in the second tier is expected to achieve a higher rate of compression than compression algorithms in the first tier, wherein compression algorithms in the second tier are implemented using a second HW device, wherein the second estimated compression ratio criteria for the second tier indicates that each compression algorithm of the second tier, for at least a second minimum percentage of data compressed using said each compression algorithm, achieves a specified compression ratio within a second specified compression ratio range which is different than the first specified compression ratio range;

providing a recommendation, in accordance with one of the plurality of sets of compression information regarding a plurality of I/O operations issued to a first of the plurality of data storage systems, regarding whether to use the first HW device or the second HW device in connection with compression on the first data storage system;

receiving workload criteria including a first threshold and a second threshold, wherein the first threshold denotes a higher workload level than the second threshold;

responsive to determining that a current workload of the first data storage system exceeds the first threshold, disabling inline compression for a first content written by first write I/O operations included in the plurality of I/O operations; and responsive to determining that the current workload of the first data storage system exceeds the second threshold but does not exceed the first threshold, compressing the first content using a first compression algorithm, wherein the first compression algorithm has an expected computation time that does not exceed a specified threshold computation time, wherein said first compression algorithm is implemented using a recommended one of the first HW device or the second HW device identified in said recommendation.

9. The system of claim 8, wherein the method further comprises:

determining, in accordance with the workload criteria of said first data storage system, to perform said inline compression of the first content written by the first write I/O operations included in the plurality of I/O operations received at said first data storage system, wherein said inline compression compresses said first content as part of an I/O path of said first write I/O operations; and selecting, in accordance with said workload criteria of said first data storage system, a particular compression algorithm to use to compress the first content, wherein the particular compression algorithm is implemented using a recommended one of the first HW device or the second HW device specified in said recommendation.

10. The system of claim 9, wherein the workload criteria includes one or more metrics that measure the current workload of said first data storage system.

11. The system of claim 10, wherein the one or more metrics include at least one of: CPU utilization in said first data storage system; component utilization of one or more types of components in said first data storage system; I/O rate regarding I/Os received by said first data storage system; data throughput denoting a data processing rate in connection with servicing reads and writes directed to data stored on said first data storage system; an amount of pending write data in a cache of said first data storage system wherein the pending write data is waiting to be destaged to backend non-volatile storage devices of said first data storage system; an amount of available cache in said first data storage system; an amount of cache consumed for storing the pending write data on said first data storage system; a number of I/O operations that have been received at said first data storage system and are waiting in one of a plurality of queues to be processed, a current queue depth of one or more front end directors of said first data storage system; a current queue depth of one or more backend directors of said first data storage system; and a number of I/Os waiting in a queue to be sent to one of a plurality of HW devices for compression.

12. The system of claim 11, wherein the component utilization includes utilization of front end directors in said first data storage system, wherein said front end directors receive I/O operations from external data storage system clients.

13. The system of claim 11, wherein the component utilization includes utilization of backend directors in said first data storage system, wherein said backend directors read data from, and write data to, backend non-volatile storage devices of said first data storage system.

14. The system of claim 8, wherein the plurality of sets of compression information are collected by a plurality of hosts.

15. A non-transitory computer readable medium comprising code stored thereon that, when executed, performs a method of determining and using a plurality of tiers of compression algorithms comprising:

receiving a plurality of sets of compression information for a plurality of compression algorithms used to compress a plurality of data sets, wherein each of the plurality of sets of compression information is collected for I/O operations issued to a different one of a plurality of data storage systems;

determining, using the plurality of sets of compression information, a first of the plurality of tiers of compression algorithms, wherein each compression algorithm of the plurality of compression algorithms in the first tier achieves first estimated compression ratio criteria for at least a first portion of the plurality of data sets, wherein compression algorithms in the first tier are implemented using a first hardware (HW) device, wherein the first estimated compression ratio criteria for the first tier indicates that each compression algorithm of the first tier, for at least a first minimum percentage of data compressed using said each compression algorithm, achieves a specified compression ratio within a first specified compression ratio range;

determining, using the plurality of sets of compression information, a second of the plurality of tiers of compression algorithms, wherein each compression algorithm of the plurality of compression algorithms in the second tier achieves second estimated compression ratio criteria for at least a second portion of the plurality of data sets, wherein each compression algorithm in the second tier is expected to achieve a higher rate of compression than compression algorithms in the first tier, wherein compression algorithms in the second tier are implemented using a second HW device, wherein the second estimated compression ratio criteria for the second tier indicates that each compression algorithm of the second tier, for at least a second minimum percentage of data compressed using said each compression algorithm, achieves a specified compression ratio within a second specified compression ratio range which is different than the first specified compression ratio range;

providing a recommendation, in accordance with one of the plurality of sets of compression information regarding a plurality of I/O operations issued to a first of the plurality of data storage systems, regarding whether to use the first HW device or the second HW device in connection with compression on the first data storage system;

receiving workload criteria including a first threshold and a second threshold, wherein the first threshold denotes a higher workload level than the second threshold;

responsive to determining that a current workload of the first data storage system exceeds the first threshold, disabling inline compression for a first content written by first write I/O operations included in the plurality of I/O operations; and responsive to determining that the current workload of the first data storage system exceeds the second threshold but does not exceed the first threshold, compressing the first content using a first compression algorithm, wherein the first compression algorithm has an expected computation time that does not exceed a specified threshold computation time, wherein said first compression algorithm is implemented using a recommended one of the first HW device or the second HW device identified in said recommendation.

16. The non-transitory computer readable medium of claim 15, wherein the method further comprises:
determining, in accordance with the workload criteria of said first data storage system, to perform said inline compression of the first content written by the first write I/O operations included in the plurality of I/O operations received at said first data storage system, wherein said inline compression compresses said first content as part of an I/O path of said first write I/O operations; and
selecting, in accordance with said workload criteria of said first data storage system, a particular compression algorithm to use to compress the first content, wherein the particular compression algorithm is implemented using a recommended one of the first HW device or the second HW device specified in said recommendation.

17. The non-transitory computer readable medium of claim 16, wherein the workload criteria includes one or more metrics that measure the current workload of said first data storage system.

18. The non-transitory computer readable medium of claim 17, wherein the one or more metrics include at least one of: CPU utilization in said first data storage system; component utilization of one or more types of components in said first data storage system; I/O rate regarding I/Os received by said first data storage system; data throughput denoting a data processing rate in connection with servicing reads and writes directed to data stored on said first data storage system; an amount of pending write data in a cache of said first data storage system wherein the pending write data is waiting to be destaged to backend non-volatile storage devices of said first data storage system; an amount of available cache in said first data storage system; an amount of cache consumed for storing the pending write data on said first data storage system; a number of I/O operations that have been received at said first data storage system and are waiting in one of a plurality of queues to be processed, a current queue depth of one or more front end directors of said first data storage system; a current queue depth of one or more backend directors of said first data storage system; and a number of I/Os waiting in a queue to be sent to one of a plurality of HW devices for compression.

19. The non-transitory computer readable medium of claim 18, wherein the component utilization includes utilization of front end directors in said first data storage system, wherein said front end directors receive I/O operations from external data storage system clients.

20. The non-transitory computer readable medium of claim 18, wherein the component utilization includes utilization of backend directors in said first data storage system, wherein said backend directors read data from, and write data to, backend non-volatile storage devices of said first data storage system.

* * * * *